(12) United States Patent
Yamada et al.

(10) Patent No.: US 6,496,411 B2
(45) Date of Patent: *Dec. 17, 2002

(54) NON-VOLATILE MULTI-LEVEL SEMICONDUCTOR FLASH MEMORY DEVICE AND METHOD OF DRIVING SAME

(75) Inventors: Naoki Yamada, Sakado (JP); Hiroshi Sato, Ome (JP); Tetsuya Tsujikawa, Hamura (JP); Kazuyuki Miyazawa, Hidaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/024,722

(22) Filed: Dec. 21, 2001

(65) Prior Publication Data

US 2002/0080649 A1 Jun. 27, 2002

Related U.S. Application Data

(63) Continuation of application No. 09/706,689, filed on Nov. 7, 2000, now Pat. No. 6,335,878, which is a continuation of application No. 09/117,369, filed as application No. PCT/JP96/01907 on Jul. 10, 1996, now Pat. No. 6,166,950.

(51) Int. Cl.[7] .............................................. G11C 11/34

(52) U.S. Cl. ............................. 365/185.03; 365/185.24
(58) Field of Search ......................... 365/185.03, 185.24

(56) References Cited

U.S. PATENT DOCUMENTS

| | | | |
|---|---|---|---|
| 5,172,338 A | 12/1992 | Mehrotra et al. | 365/185.03 |
| 5,497,354 A | 3/1996 | Sweha et al. | 365/230.06 |
| 6,166,950 A | * 12/2000 | Yamada et al. | 365/185.03 |

FOREIGN PATENT DOCUMENTS

| | | |
|---|---|---|
| JP | 6-77437 | 3/1994 |
| JP | 9-91971 | 4/1997 |

* cited by examiner

Primary Examiner—M. Tran
(74) Attorney, Agent, or Firm—Antonelli, Terry, Stout & Kraus, LLP

(57) ABSTRACT

In a nonvolatile semiconductor memory device in which a plurality of threshold values are set to store multi-level data in a memory cell, bits of multi-bit data are separately written into a memory cell according to an address signal or a control signal to effect the reading and erasing. Concretely, the memory array is so constituted that it can be accessed by three-dimensional address of X, Y and Z, and multi-bit data in the memory cell is discriminated by the Z-address.

8 Claims, 20 Drawing Sheets

NON-VOLATILE MULTI-LEVEL SEMICONDUCTOR FLASH MEMORY DEVICE AND METHOD OF DRIVING SAME

This is a continuation of application Ser. No. 09/706,689, filed Nov. 7, 2000 now U.S. Pat. No. 6,335,878, which is a continuation of Ser. No. 09/117,369, filed Jul. 28, 1998, now U.S. Pat. No. 6,166,950, which is a 371 of PCT/JP96/00907 filed Jul. 10, 1996, incorporated by reference.

BACKGROUND OF THE INVENTION

The present invention relates to a semiconductor memory device and, particularly, to a technology that can be particularly effective when adapted to a memory system for multi-level data in a nonvolatile semiconductor memory device, such as a nonvolatile memory device (hereinafter simply referred to as a flash memory) which is capable of electrically erasing a plurality of stored data at one time.

In a flash memory, a nonvolatile memory element having a control gate and a floating gate is used as a memory cell, and the memory cell is constituted by a single transistor. In such a flash memory, the programming operation is carried out by applying a voltage of about 4 V(Volt) to the drain region of the nonvolatile memory element, as shown in FIG. 21, applying a voltage of about −10 V to a word line to which a control gate CG is connected, and discharging the electric charge from the floating gate FG by using a tunneling current to establish a state of a low threshold voltage (logic "0"). To carry out the erasing operation, as shown in FIG. 22, a voltage of about −3 V is applied to the well region, to the drain region and to the source region, and a voltage of as high as 10 V is applied to the control gate CG to generate a tunneling current in order to inject a negative charge into the floating gate FG and to maintain a high threshold value (logic "1"). Thus, data of one bit is stored in a memory cell.

There has been proposed the concept of a so-called "multi-level" memory to store data of two or more bits in a single memory cell in order to increase the storage capacity. An example of such a multi-level memory has been disclosed in, for example, Japanese Patent Application H7-14031 (14031/1995) which corresponds to U.S. patent application Ser. No. 08/860,793.

In such a multi-level memory of the above-mentioned patent application, consecutive two-bit data "01", "00", "10" and "11" are subjected to logical conversion, and are stored correspondedly to one of the threshold voltage ranges of 1.2V or lower, 1.6 to 2.3 V, 2.8 to 3.5 V, and 4 V or higher of the memory cell as shown in FIG. 23. In the above-mentioned memory, therefore, it is impossible to identify the stored data unless a reading operation is executed three times while successively changing the level of the word line to, e.g., 1.4 V, 2.6 V, 3.7 V, causing a drawback in that a long time is needed to read the data.

SUMMARY OF THE INVENTION

The object of the present invention is to provide a multi-level storage-type nonvolatile semiconductor memory device for which the reading time can be shortened by decreasing the number of accesses to the word line when reading the data, and a method of driving such a device.

The above and other objects, and novel features of the present invention will become obvious from the following description and the accompanying drawings.

The outline of a representative example of the invention disclosed in this application will be described below.

That is, in a nonvolatile semiconductor memory device in which a plurality of threshold values are set to store multi-level data in a memory cell, each bit of multi-bit data is separately written into a memory cell depending upon an address signal or a control signal and the bits are stored hierarchically. In this case, data of a plurality of bits may be consecutively written in one memory cell, of after data has been written in all memory cells bit by bit, the data of remaining bits may be successively overwritten in the memory cells.

Thus, when two bits are stored in one memory cell, the first bit can be read out by accessing the word line only one time and the succeeding bit can be read out by accessing the word lines only twice while changing the level to read the data. Thus, the total number of accesses to the word line is decreased, and the time taken to read data is shortened.

DETAILED DESCRIPTION OF THE PREFERRED EMBODIMENTS

Figure 1:
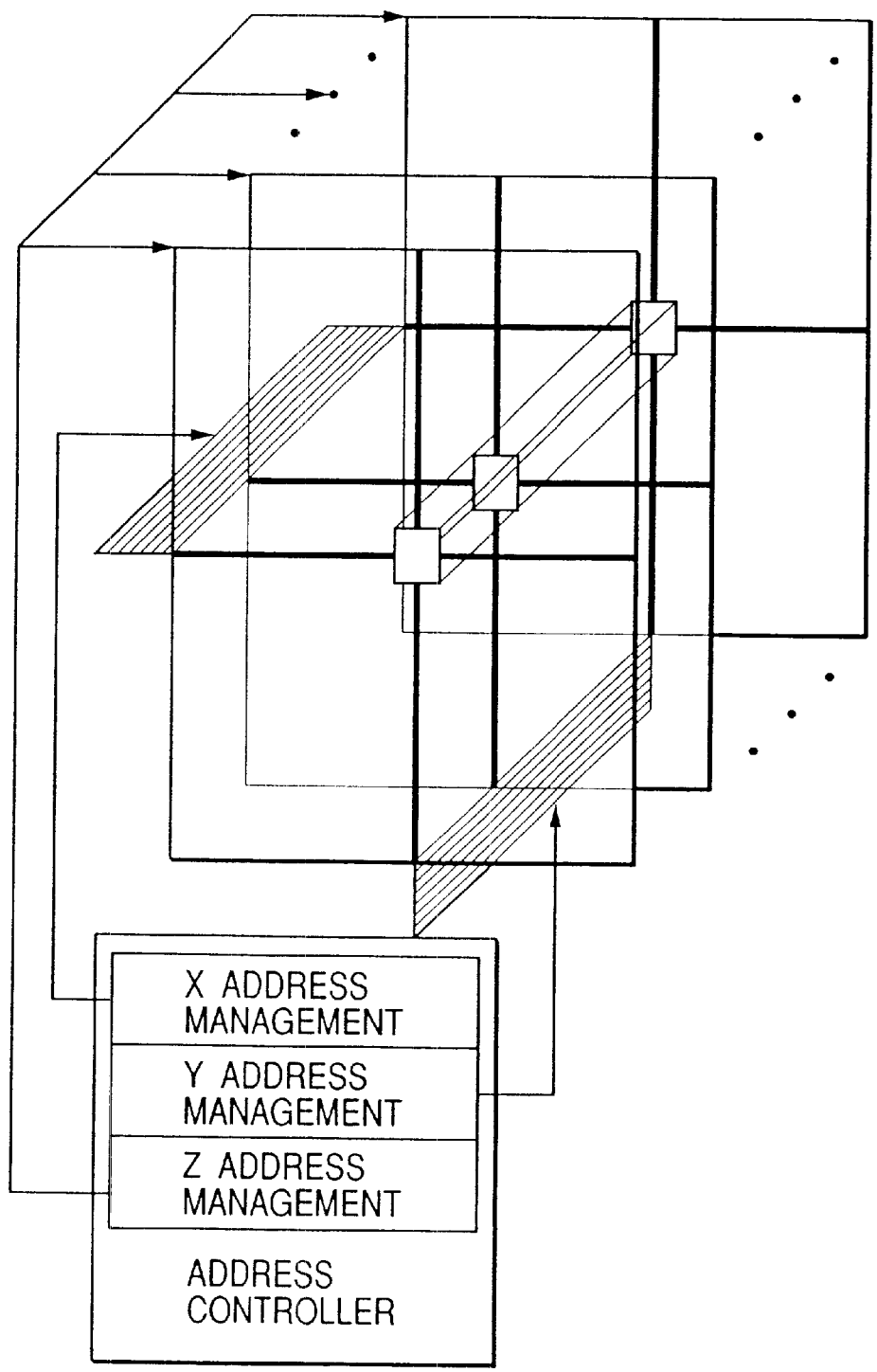
FIG. 1 is an explanatory diagram illustrating the concept (the constitution of the address space) of a data storage system in a multi-level flash memory according to the present invention.

FIG. 1 illustrates the concept of the address space in a memory capable of storing multilevel values in a memory cell, to which the present invention is applied.

Like the address system in a conventional general semiconductor memory, according to the present invention, a memory cell can be selected according to the X-address and Y-address. According to the present invention, in addition, each memory is so constituted as to store data of a plurality of bits and, besides, correspondingly a plurality of bits (each bit is expressed by a value of "0" or "1") in a memory cell are selected or designated by an address (hereinafter referred to as a Z-address) different from the X-addresses and the Y-addresses (hereinafter referred to as a three-dimensional address system). In the three-dimensional address system, three methods for applying the Z-address are conceivable: ① a method in which the Z-address is input so as to share the same input pins with the X- and Y-addresses, ② a method in which an independent special-purpose input pin is provided, and ③ a method in which the Z-address is input while being included in a command code.

The method ① in which the Z-address is input so as to share an input pin with the X- and Y-addresses includes a method in which, when the number of bits is different between the X-addresses and the Y-addresses, the pins not used when the address of the smaller number of bits is input are used for the input of the Z-address; and an address multiplex method in which the X-, Y- and Z-addresses are inputted in a time division manner through common pins. The pin sharing method includes a method in which the pins for the data and command code are shared for the input of the X-, Y- and Z-addresses. Among the above-mentioned methods, in the method ② in which an independent special-purpose input pin is provided, the signal may be regarded as not an address signal, but as a control signal or a selection signal (the reason is that when the number of bits of data stored in a memory cell is "2", in particular, the address for discriminating it can be composed of only a single bit). Therefore, a signal for discriminating the bit in the memory cell should not be affected by what it is called, but should be judged substantially.

Figure 2:
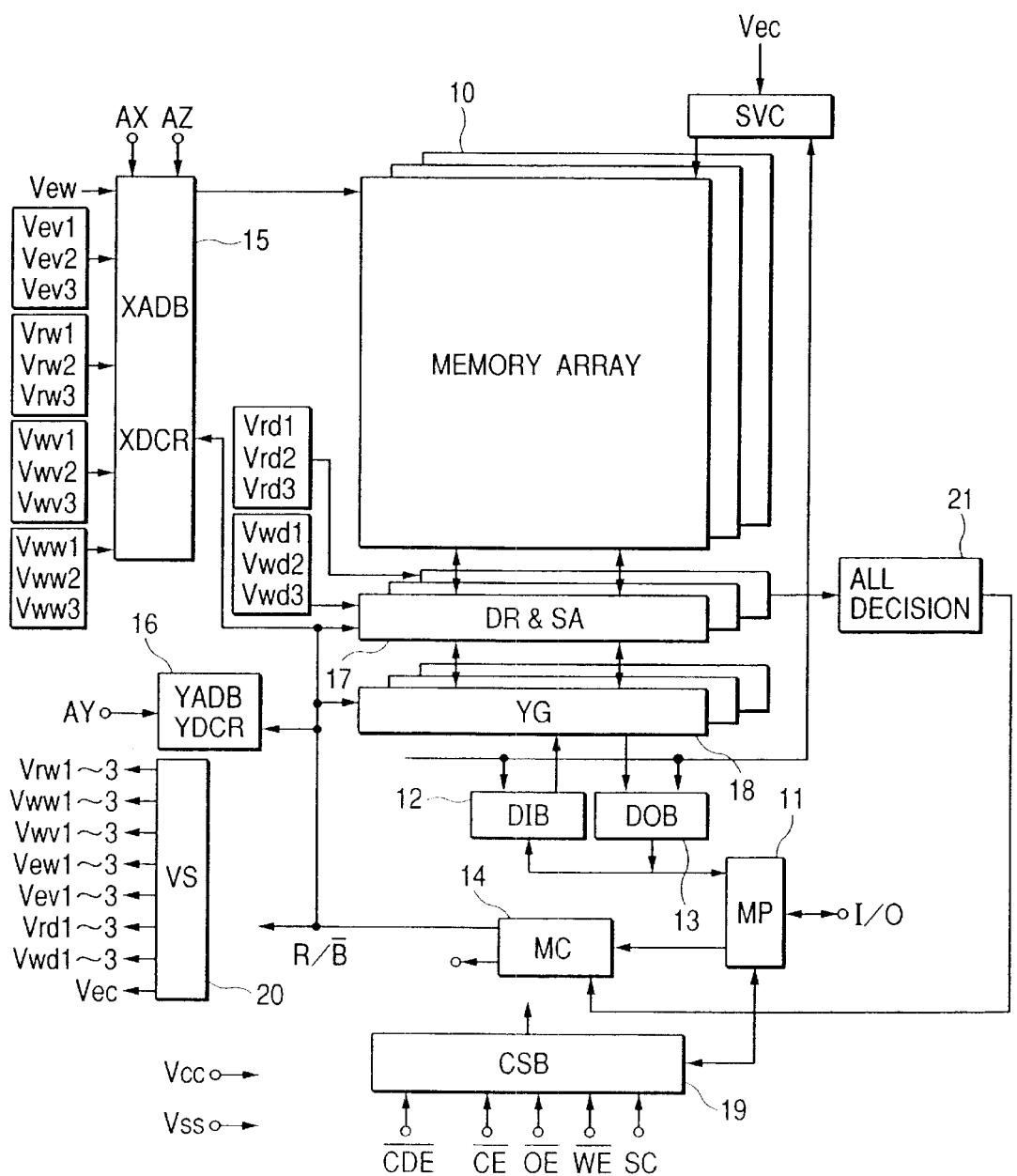
FIG. 2 is a block diagram illustrating an embodiment of the multi-level flash memory according to the present invention.

FIG. 2 is a block diagram of an embodiment wherein the method ②, in which an independent special-purpose input pin is employed, is applied to a flash memory, among the above-mentioned access methods.

The memory of this embodiment is so constituted that the operation mode, such as data writing, reading or erasing, is changed over depending upon a command code input from an external controller, and the input pins of the command code are also used as data input/output pins I/O.

In FIG. 2, reference numeral 10 denotes a memory array in which memory cells constituted by MOSFETs having a floating gate are arranged in the form of a matrix, 11 denotes a multiplexer connected to input/output pins I/O, 12 denotes a data input buffer which receives write data through the multiplexer 11, 13 denotes a data output buffer which outputs the data read out from the memory array 10 to an external unit through the input/output pins I/O, and 14 denotes a command decode control circuit for generating internal control signals by decoding a command code given from the external unit. The command decode control circuit 14 is equipped with a control function (sequencer) for successively generating and outputting the control signals for the circuits in the memory in order to execute the desired processing according to the command based upon the decoding result of the command code, and automatically executes the corresponding processing by decoding the command code that is given. Like the control unit in a central processing unit (CPU) of the microprogram type, the control function is constituted by a ROM (read-only memory) in which are stored a series of micro instructions necessary to execute the command (instruction), and which generates the start address of the group of micro-instructions corresponding to the command code and gives it to a micro ROM ($\mu$ROM) so that a micro program is started.

In FIG. 2, furthermore, reference numeral 15 denotes an X-address decoder which decodes the X-addresses that are input from the external unit, enables a word line in the memory array 10 to assume a selection level, and determines selection of the level (Vew1-3, Vrw1-3, Vwv1-3, Vww1-3, Vev1-3) according to the Z-address that is input; 16 denotes a Y-address decoder which decodes the Y-addresses that are input from the external unit to generate a selection signal; 17 denotes a sense latch circuit equipped with sense amplifiers, the number of which corresponds to the number of data lines, and which are connected to the data lines in the memory array 10, detects the levels of the data lines and holds the programming data to drive the data lines to a potential corresponding to the data; and 18 denotes a sequence of column switches that are selectively turned on by a selection signal from the Y-address decoder 15, and connects a data line corresponding to the Y-addresses in the memory array 10 to the data input buffer 12 or to the data output buffer 13.

In addition to the above-mentioned circuits, the multilevel flash memory of this embodiment is equipped with a control signal buffer circuit 19 which takes in control signals from the external unit and feeds them to the command decode control circuit 14; an internal power source-generating circuit 20 comprising charge pump circuits or the like for generating voltages needed in the chip, such as reading voltages Vrw1-3, programming voltages Vww1-3, erasing voltages Vew1-3 and verifying voltages Vev1-3 based upon the power source voltage vcc supplied from an external unit; and an all decision circuit 21 for deciding whether the programming or the erasure has finished or not based upon the data in the sense latch sequence 17 at the time of the programming or erasing.

The command decode control circuit 14 further has a function for generating and outputting a ready/busy signal R/B representing whether the device is accessible from the outside or not to the internal circuits and to the external units.

Moreover, the flash memory of this embodiment shares external terminals (pins) I/O for input of the programming data and the commands. For this purpose, the control signal buffer circuit 19 changes over the multiplexer 11 according to control signals input from the external unit, discriminates the signal input through the input/output pins I/O, and feeds them to the data input buffer 12 or to the command decode control circuit 14. The control signals inputted to the flash memory of this embodiment from the external unit include a reset signal RES, a chip selection signal CE, a programming control signal WE, and output control signal OE, a command data enable signal CDE representing that the command code and the data are valid, a serial clock SC, etc. Though there is no particular limitation, the flash memory of this embodiment is so constituted as to read the data of a row or word line held in the sense latch circuit 17 in synchronism with the clock SC, to send the data to an external unit, and to transfer a row of the programming data input from the external unit to the sense latch circuit 17 in synchronism with the clock SC. In this case, no Y-address is required.

Figure 3:
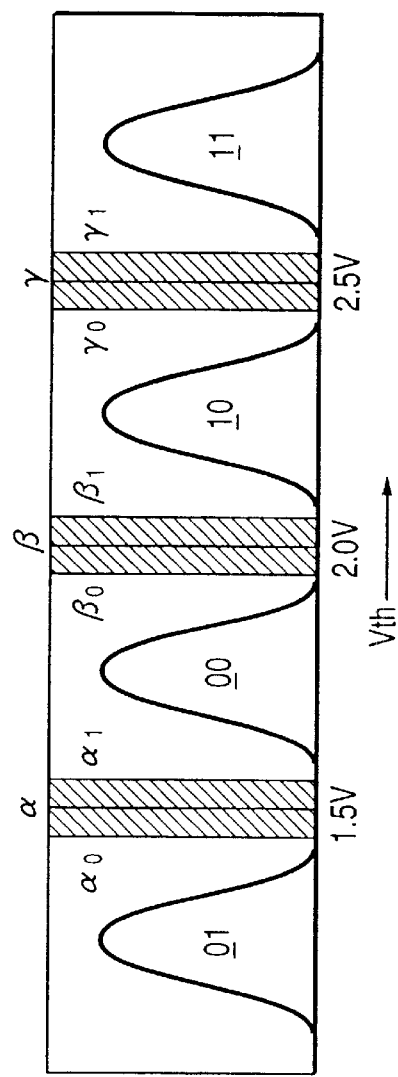
FIG. 3 is an explanatory diagram illustrating the relationship between the threshold values of memory cells and the stored data in the multi-level flash memory according to the present invention.

FIG. 3 illustrates the relationship (definition) between the stored data (two bits) and the distribution of threshold values of an element when one of four threshold values is stored in a memory cell. In this embodiment, the data is written into a memory cell so as to assume any one of the four threshold values, $\alpha$ or lower, $\alpha$ to $\beta$, $\beta$ to $\gamma$, or $\gamma$ or higher. By the programming method that will be described later, a memory cell that has a threshold value of $\alpha$ or lower is defined as a cell for storing 2-bit data "01", the memory cell that has a threshold value of $\alpha$ to $\beta$ is defined as a cell for storing 2-bit data "00", the memory cell that has a threshold value of $\beta$ to $\gamma$ is defined as a cell for storing a 2-bit data "10", and the memory cell that has a threshold value of $\gamma$ or higher is defined as a cell for storing a 2-bit data "11".

In FIG. 3, $\alpha$, $\beta$ and $\gamma$ are values of the word line-reading levels at the time of reading the data. Concrete values $\alpha$, $\beta$ and $\gamma$ are determined depending upon the power source voltage. As an example, when the power source voltage is 3.3 V, $\alpha$ is 1.5 V, $\beta$ is 2.0 V, and $\gamma$ is 2.5 V. In FIG. 3, furthermore, the hatched areas are inhibition regions having threshold values which are not effective in order to prevent erroneous reading, and $\alpha 0$, $\alpha 1$, $\beta 0$, $\beta 1$, $\gamma 0$ and $\gamma 1$ represent values of reading levels in the verifying operation that is executed during programming or after erasing. Out of the 2-bit data "**", the first bit (high-order bit) is the one (hereinafter referred to as the first programmed data) programmed first in time, and the second bit (low-order bit) is the one (hereinafter referred to as the second programmed data) programmed next in time.

Figure 4:
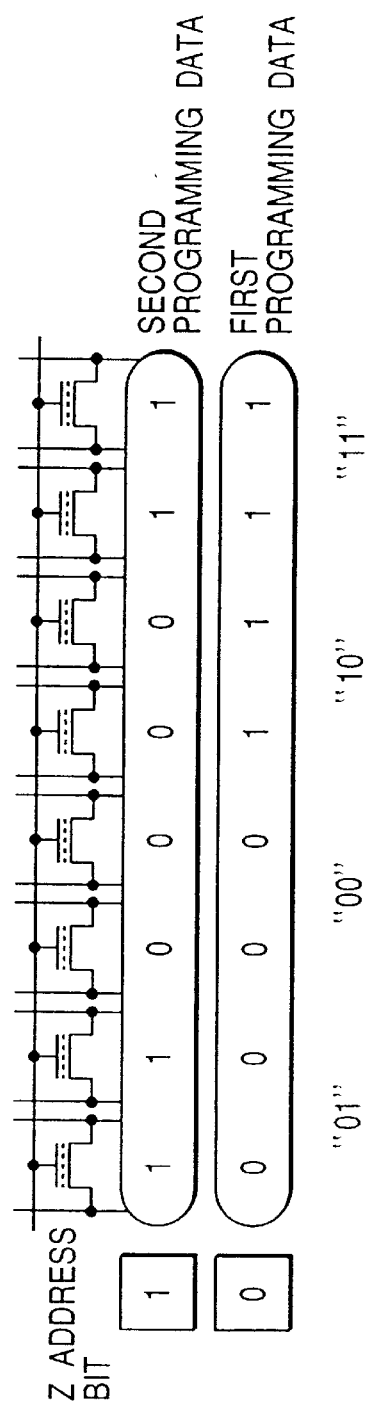
FIG. 4 is a diagram illustrating the relationship between the data stored hierarchically in a memory cell and the Z-address for discriminating them in the multi-level flash memory according to the present invention.

When 2-bit data are stored in a memory cell as described above, each of the bits can be selected by using the Z-address. That is, as shown in FIG. 4, when the Z-address is "0", the first programming data is designated among the 2-bit memory data in the memory cell connected to the selected word line,and, when the Z-address is "1", the second programming data is designated among the 2-bit memory data in the memory cell connected to the selected word line. When the first programmed data is read out, however, the selected word line assumes the potential $\beta$ to execute the reading operation one time as will be described later. When the second programmed data is read out, the selected word line assumes the potentials $\alpha$ and $\gamma$ to execute the reading operation two times.

Next, the method of programming data (method of changing the threshold value) applied to the flash memory of this embodiment will be described with reference to FIGS. 5(A) to 5(D).

Figure 5A:
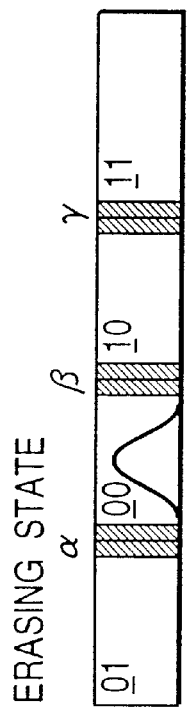
FIGS. 5(A) to 5(D) explanatory diagrams illustrating a change in the threshold value of the memory cell at the time of programming and erasing in the multi-level flash memory according to the present invention.

As shown in FIG. 5(A), all memory cells are brought into the erasing state (the threshold value has the second smallest value, i.e., about 1.7 V, and the memory data is "00") prior to programming the data. In establishing the erasing state, it is also possible to use a method in which all memory cells first have the data "11" of the greatest threshold value stored therein and, then, the threshold value Vth in all memory cells is returned to the erasing state "00".

Figure 5B:
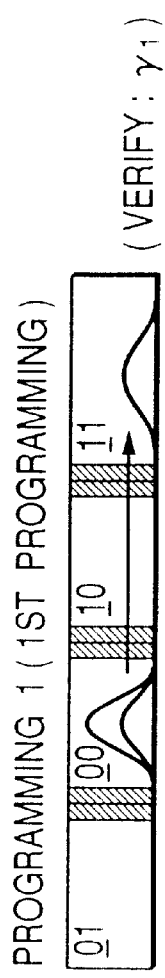

Next, the first programming data is written. At this moment, for the memory cells in which the data "1" is to be stored, a bias is applied to them as shown in FIG. 5(B), and the programming is so effected that the threshold value of the memory cells of 1.7 V, which represents the erasing state, assumes the highest threshold value of about 2.8 V. At the step where the writing of the first programming data is finished, there exists neither memory cells having the smallest threshold value nor memory cells having the second largest threshold value. After the programming, the word line assumes the level $\gamma 1$ to execute a verification. The memory of this embodiment can be used in a manner such that the data are read by only writing the first programming data into all memory cells, not writing the second programming data, and setting the level of the word line to $\beta$. In this case, the Z-address necessarily is "0" (or "1"). When each of the memory regions corresponding to "0" and "1" of the Z-address is defined as a plane, the above-mentioned method is the one that uses one plane only.

Figure 5C:
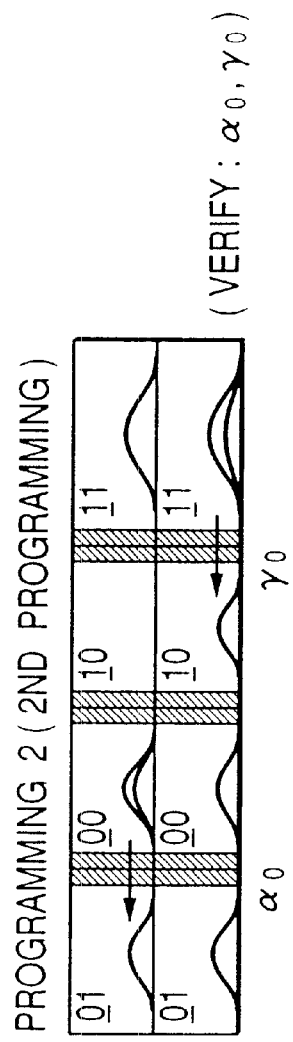

When two planes are used, the second programming data is written after the first programming data is written. At this moment as shown in FIG. 5(C), the writing into the memory cell of which the first programming data is "0" is distinguished from the writing into the memory cell of which the first programming data is "1". In writing the first programming data, as described above, a bias is applied to the memory cell of which the data is "1" so as to increase the threshold value (hereinafter referred to as up-writing). In writing the second programming data,as shown in FIG. 5(C), on the other hand, the data is written so as to lower the threshold value (hereinafter referred to as down-writing). In the case of the writing of the first programming data, it is possible to increase the threshold values of only the memory cells into which the data "1" among the memory cells of the state "00" is desired to be written, in order to selectively establish the state "11". It is, however, also possible to first increase the threshold values of all memory cells which are in the state "00" and to decrease the threshold value of only those memory cells of which the first programming data is "0".

In this embodiment, furthermore, when the first programming data is "0" and the second programming data is "1", a bias is applied to the memory cells so as to lower the threshold value, so that the state is changed to a state of the smallest threshold value (the threshold value is about 1.0 V, and the memory data is "01"). When the first programming data is "1" and the second programming data is "0", a bias is applied to the memory cells so as to lower the threshold value, whereby the state is changed to a state of the second largest threshold value (threshold value is about 2.3 V, and the memory data is "10"). In this embodiment, though there is no particular limitation, the programming is, first, so effected that the first programming data is "0" and the second programming data is "1" and, then, the programming is so effected that the first programming data is "1" and the second programming data is "0". The bias voltage or the programming pulse width of when the threshold value is lowered to 1.0 V may be made different from that of when the threshold value is lowered to 2.3 V. This is because the programming characteristics are not the same.

Meanwhile, when the first programming data is "0" and the second programming data is "0", or when the first programming data is "1" and the second programming data is "1", the data line is fed with no bias that changes the threshold value of the memory cell. After the programming, verification is effected by causing the word line to assume the levels α0 and γ0. Table 1 shows how the threshold value of the memory cell changes with the programming operation. The threshold values of each memory cell are Vth1, Vth2, Vth3 and Vth4 (Vth1<Vth2<Vth3<Vth4).

TABLE 1

| First programming data | | 0 | 0 | 1 | 1 |
|---|---|---|---|---|---|
| Second programming data | | 1 | 0 | 0 | 1 |
| Change in threshold value | 1st programming | no change | no change | Vth2→ Vth4 | Vth2→ Vth4 |
| | 2nd programming | Vth2→ Vth1 | no change | Vth4→ Vth3 | no change |
| Final threshold value | | Vth1 | Vth2 | Vth3 | Vth4 |

Figure 5D:
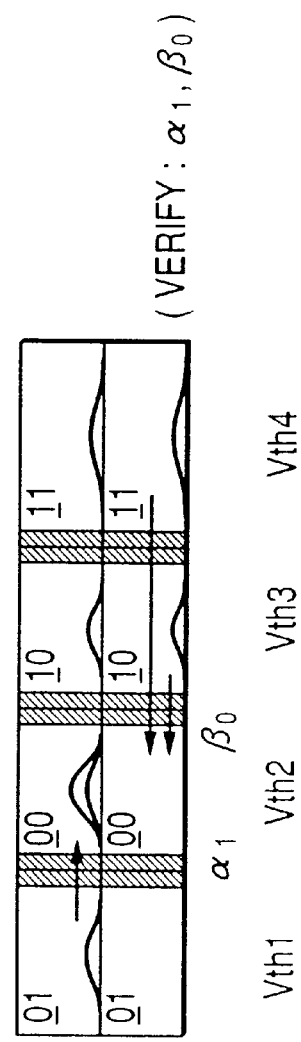

To erase the data as shown in FIG. 5(D), up-writing of memory cells having the smallest threshold value (memory data "01") is effected, and the down-writing of memory cells having the largest threshold value (memory data "11") and memory cells having the second largest threshold value (memory data "10") is effected. Thus, the threshold values of all memory cells are changed into the second smallest state (memory data "00"). Besides, as will be described later, erasing of the second programmed data and erasing of the first programmed data may be performed. Verification after the erasing is effected by causing the word line to assume the levels α1 and β0.

Figure 6:
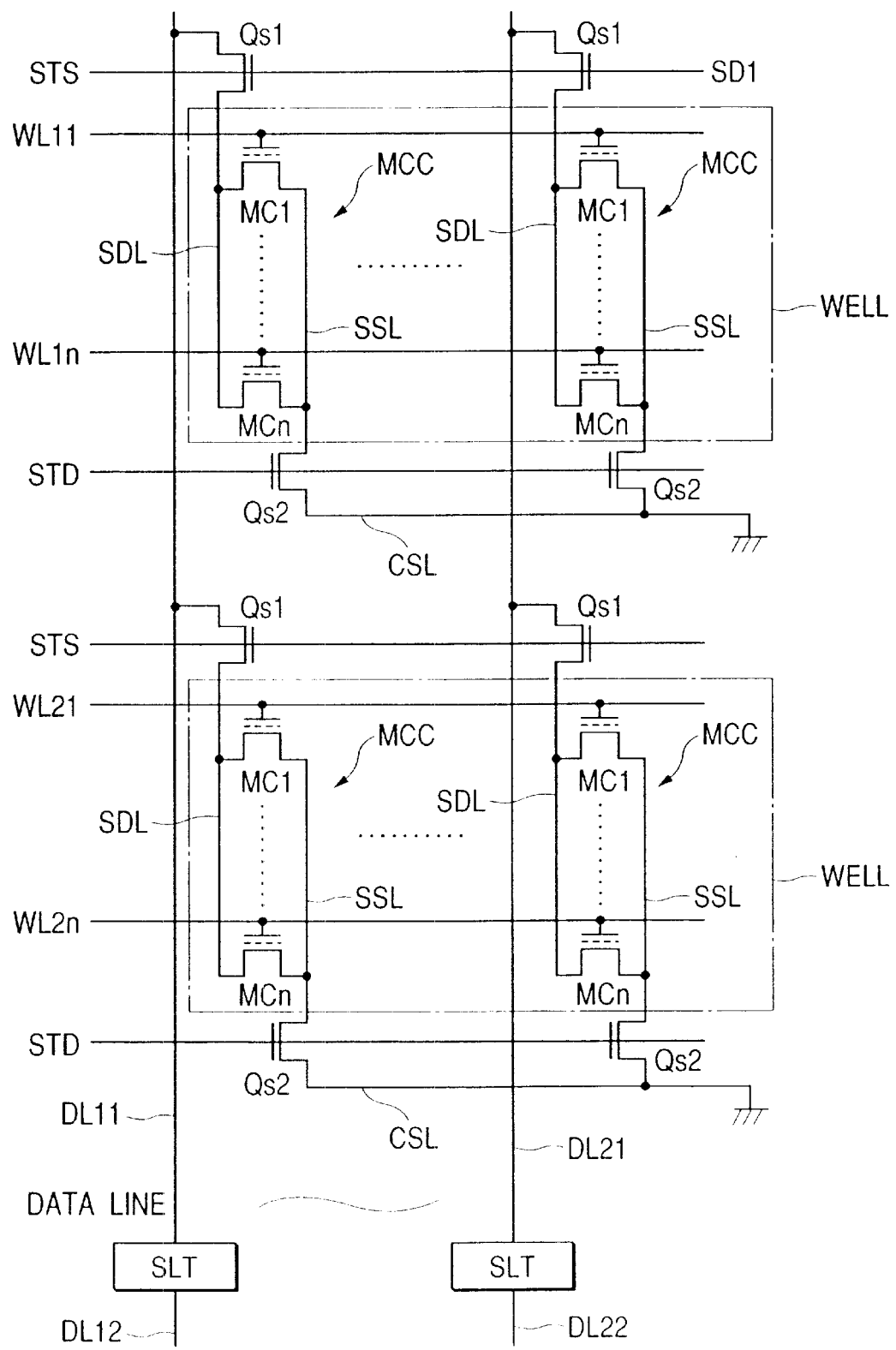
FIG. 6 is a schematic circuit diagram illustrating a memory array.

FIG. 6 illustrates a concrete example of the memory array 10. The memory array of this embodiment is constituted by two mats. A sense latch circuit SLT is disposed between the two mats. The data line in the unselected mat is precharged to a half-precharge level which is half the precharge level of the data line in the selected mat. The sense latch circuit is so constituted as to detect the data in a differential way. The memory array is arranged symmetrically with respect to the sense latch circuit SLT. Accordingly, FIG. 6 illustrates the sense latch circuit SLT and only the mat on one side.

The memory array 10 of this embodiment includes, as shown in FIG. 6, a plurality of memory sequences MCC each constituted of n memory cells (MOSFETs having a floating gate) MC1 to MCn arranged in parallel in the direction of a column, having sources and drains which are commonly connected, and the sequences are arranged in the row direction (direction of word lines WL) and in the column direction (direction of main data lines DL). In each memory sequence MCC, the drains and sources of n memory cells MC1 to MCn are connected to a common subdata line SDL and to a common subsource line SSL. The subdata line SDL is connected to the main data line DL through a switching MOSFET Qs1. The subsource line SSL can be connected to a grounding point or to a negative voltage through a switching MOSFET Qw2 and a common source line CSL.

Among the plurality of memory sequences MCC, those arranged in the direction of word lines are formed in the same well region WELL over the semiconductor substrate. To increase the threshold values of the memory cells, a negative voltage such as −3 V is applied to the well region WELL and a voltage such as 10 V is applied to the word lines sharing the well region, to enable the upward writing. To erase the data, all switching MOSFETs Qst1, Qst2 sharing the well region are turned on, and the negative voltage of −3 V is applied to the sources and drains of the memory cells.

To lower the threshold value of the memory cell, on the other hand, a negative voltage such as −10 V is applied to the word line to which a memory cell to be selected is connected, a voltage such as 4 V is applied to the main data line DL corresponding to the memory cell to be selected, the switching MOSFET Qs1 on the subdata line SDL to which the selected memory cell is connected is turned on, and a voltage of 4 V is applied to the drain region. However, the switching MOSFET Qs2 on the subsource line SSL is kept off.

To read the data, voltages such as 1.5 V, 2.0 V or 2.5 V are applied to the word line to which is connected a memory cell that is to be selected, the main data line DL corresponding to the memory cell to be selected is precharged to a potential such as 1 V, and the switching MOSFET Qs1 on the subdata line SDL to which the selected memory cell is connected is turned on. The switching MOSFET Qs2 on the subsource line SSL is turned on, and the ground potential is applied thereto. At this moment, when the selected memory cell is on, the electric charge on the corresponding data line is discharged into the common source, and the potential decreases. The potential is amplified through the sense latch circuit SLT connected to an end of the main data line DL. At the time of reading the data, the sense latch circuit SLT detects the level of the data line and holds it. At the time of programming, the sense latch circuit SLT holds the programming data and applies a potential corresponding to the data that is held to the data line.

Figure 7:
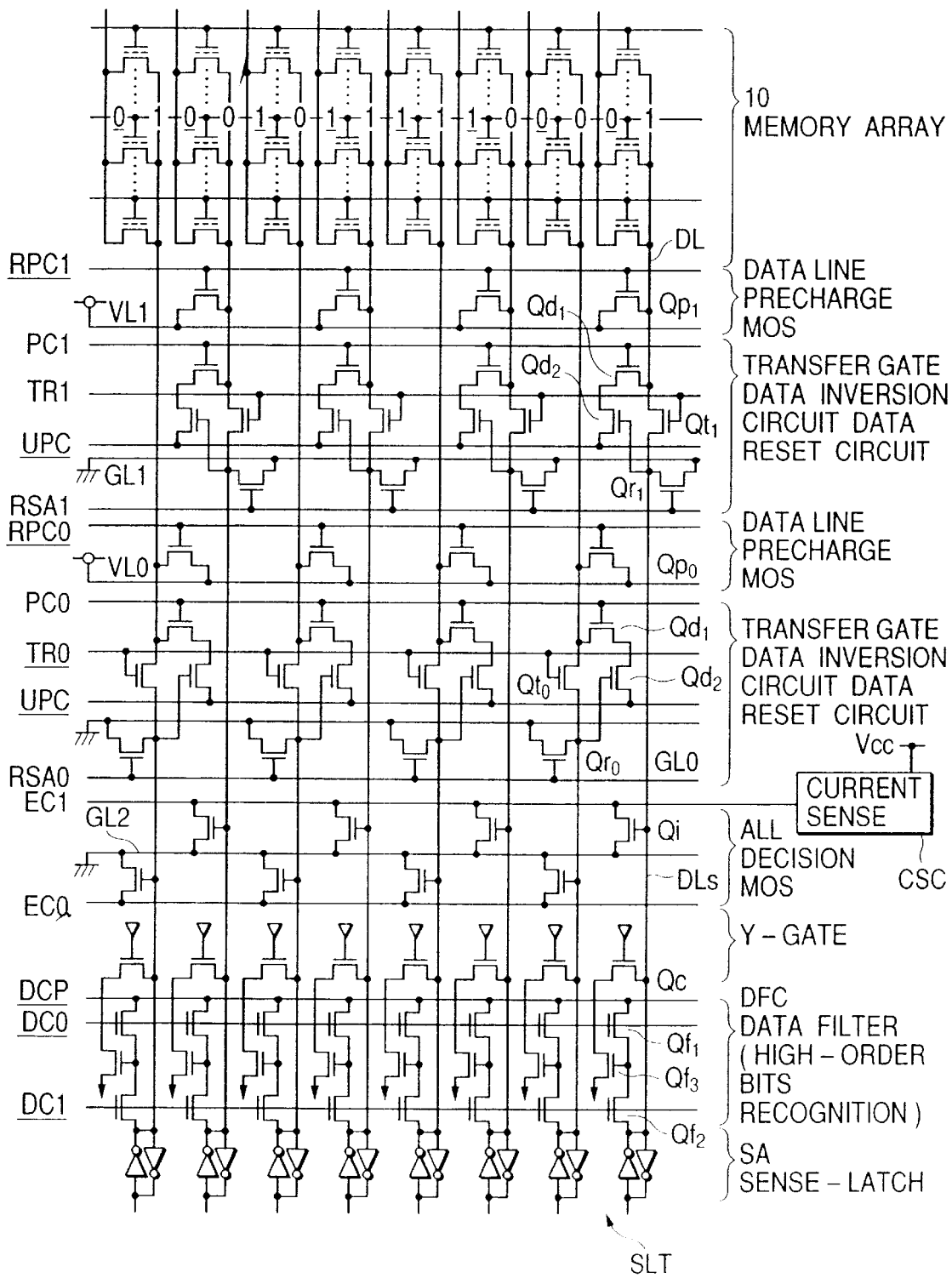
FIG. 7 is a schematic circuit diagram illustrating a data latch circuit.

FIG. 7 illustrates the sense latch circuits SLT connected to the data lines. As shown, each sense latch circuit SLT has a sense amplifier SA in which the input/output terminals of the two CMOS inverters are mutually connected. Between the sense amplifiers SA and the memory array 10, there are provided precharging MOSFETs Qp0, Qp1, data transfer MOSFETs Qt0, Qt1 capable of connecting/cutting off one input/output terminal of the sense amplifier SA and the main data line DL, data inversion circuits DIC, resetting MOSFETs Qr0, Qr1, a MOSFET Qj for all decision, a column switching MOSFETs Qc, a data filter circuit DFC for recognizing the first programmed data, and the like.

In FIG. 7, the reason why two data line precharging MOSFETs Qp, two data transfer MOSFETs Qt, two data inversion circuits DIC and two resetting MOSFETs Qr are shown is that those connected to oddly-numbered data lines and those connected to evenly-numbered data lines are separately shown. A selection signal from the Y-decoder circuit is applied to the gate of the column switching MOSFET Qc, and the data line is connected to the data input buffer 12 and to the data output buffer 13 through the column switching MOSFET Qc and the input/output line I/O. Though not shown, each sense amplifier SA is connected to the common power source line and to the ground line via power source feeding/cutting off switching MOSFETs. The sense amplifier SA is activated upon turning these MOSFETs on and is inactivated upon turning these MOSFETs off.

The source terminal of the precharging MOSFET Qp0 or Qp1 is connected to the main data line DL, the drain terminal thereof is connected to the voltage feeding line VL0 or VL1, and the gate terminal thereof is fed with a precharge control signal RPC0 or RPC1. At the time of reading the data, the precharging MOSFET Qp0 or Qp1 is turned on to precharge the main data line DL to a level such as 1 V. The data transfer MOSFETs Qt0 and Qt1 are connected between the main data line DL in the memory array 10 and the main data lines DLs on the sense amplifier SA side, and the gate terminals thereof are fed with transfer control signals TR0, TR1. After the word line is raised, the data transfer MOSFETs Qt0 and Qt1 are turned on to transmit the level of the data line to the sense amplifier SA. At the time of programming, meanwhile, the data transfer MOSFETs Qt0 and Qt1 are turned on, so that the programmed data held in the sense amplifier SA is transmitted to the main data line DL.

In the data inversion circuit DIC, two MOSFETs Qd1, Qd2 are connected in series between the main data line DL and the voltage feeding line UP. Control signals PC0, PC1 are applied to the gate terminal of the MOSFET Q1, and the main data line DLS on the sense amplifier SA side is connected to the gate terminal of the MOSFET Qd2. The drain terminals of the resetting MOSFETs Qr0, Qr1 are connected to the main data line DLs, the source terminals thereof are connected to the ground lines GL0, GL1, and the gate terminals thereof are fed with data reset signals RSA0, RSA1. As Qd1 and Qd2 are turned on, the main data line DLs is discharged to the ground potential.

The MOSFET Qj for all decision is connected between the sense lines EC0, EC1 and the ground line GL2, the gate terminal thereof is connected to the main data line DLs on the sense amplifier SA side, and a current sense circuit CSC constituting the all decision circuit 21 is connected to one end of each of the sense lines EC0, EC1. Upon detecting whether the data lines are all at the low level or not, it is determined whether the data read out are all "0". That is, when any one of the data read out is "1", the corresponding MOSFET Qj is turned on, and a current flows to the ground point through the sense lines EC0, EC1, and is hence detected by the current sense circuit CSC.

The data file circuit DFC for recognizing the first programming data is constituted by MOSFETs Qf1, Qf2 connected in series between the voltage feeding line DCP and one input/output terminal of the sense amplifier SA, and a transfer MOSFET Qf3 connected in series with the column switching MOSFET Qc. A control signal DC0 is applied to the gate terminal of the MOSFET Qf1, and a control signal DC1 is applied to the gate terminal of the MOSFET Qf2. The MOSFETs Qf1 to Qf3 are controlled by the control signals and by the data held in the sense amplifier SA, in order to write the second programming data that corresponds to the above-mentioned first programming data. That is, the control signal DC0 is set to the high level and the DC1 is set to the low level to turn the Qf1 on and the Qf2 off, whereby a signal of the high level is supplied to the gate of Qf3 to thereby connect all data lines to the input/output lines I/O. Meanwhile, the control signal DC0 is set to the low level and the DC1 is set to the high level to turn the Qf1 off and the Qf2 on, whereby a signal of a level corresponding to the data held in the sense amplifier SA is fed to the gate of Qf3, and the data lines are selectively connected to the input/output lines I/O.

Next, with reference to a flowchart of FIG. 8 a procedure for reading the data from the memory cell of the embodiment will be described. FIG. 9 illustrates changes in the signal lines in the memory array and in the sense latch circuit which occur when the data is to be read out. Symbols shown in FIG. 8 correspond to symbols of signals shown in FIGS. 6 and 7. R or L as the last letter of some of the symbols is used for discriminating whether the signal relates to the upper mat or the lower mat on both sides of the sense latch circuit SLT. PRL and PRR represent signals for precharging the data lines, and correspond to the code RPC in FIG. 7. Furthermore, DPB denotes an on/off control signal of the power source for sense latch.

Figure 8:
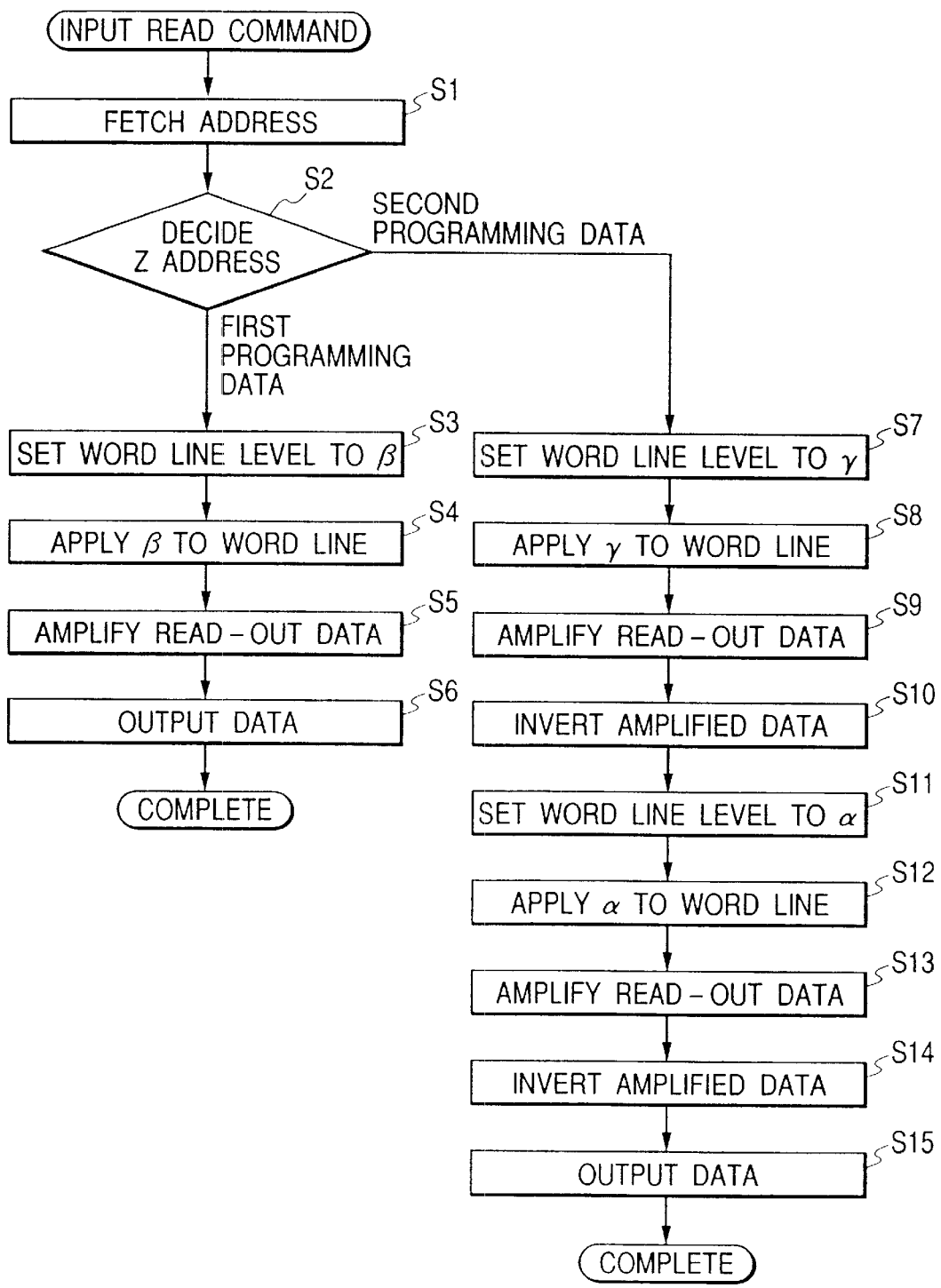
FIG. 8 is a flowchart illustrating a procedure for reading the multi-level flash memory according to the embodiment.
Figure 9:
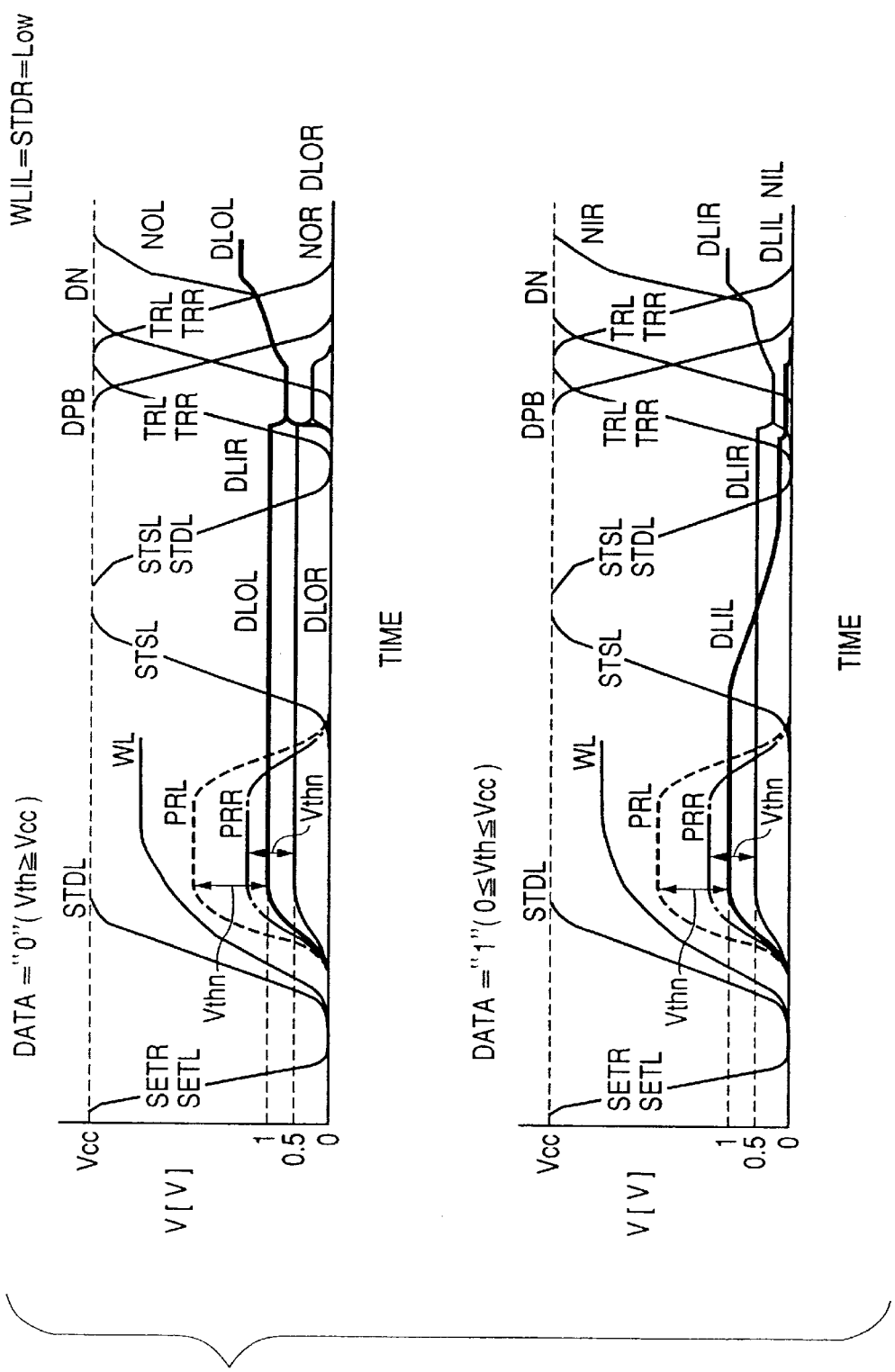
FIG. 9 is a timing chart illustrating the timings of signals in the memory array at the time of reading the multi-level flash memory of the embodiment.

Referring to FIG. 8, the reading operation is started upon the input of a read command. When the command that is input is a read command, an address signal inputted just after or simultaneously with the command (step S1) is fetched. It is then decided whether the data to be read out is the first programmed data or the second programmed data in the memory cell based upon the Z-address among the addresses that are fetched (step S2). When it is decided that the command is for reading the first programmed data, the level of the word line is set to β which is the intermediate read-out level, the main data line DL is precharged, and the X-address is decoded to raise the word line WL (steps S3, S4). At this moment, furthermore, the switching MOSFET Qs1 of the subdata line is turned on.

Thus, the level of the data line is held or discharged depending upon the first programmed data in the memory cell connected to the selected word line and, hence, the switching MOSFET Qs2 on the subsource line and the data transfer MOSFET Qt are turned on, so that the level of the data line is transmitted to the sense amplifier SA and the power source is supplied to the sense amplifier to activate it (step S5). Thus, the read-out data is amplified and held in the sense amplifier, whereby the column switch Qc is turned on, and the read-out data is sent to the data output buffer and output to an external unit (step S6).

When it is decided that the data to be read out at the step S2 is the second programmed data in the memory cell, the procedure proceeds to a step S7 whereby the level of the word line is set to γ which is the highest read-out level, the main data line DL is precharged and, at the same time, the X-address is decoded to raise the word line WL (step S8). Then, the level of the data line is transmitted to the sense amplifier SA to activate it and to amplify the data that is read out (step S9). Then, the data inversion circuit DIC is controlled, the data on the data line is inverted by utilizing the data held by the sense amplifier SA and is used for the precharging operation at the next reading time (step S10). Thereafter, the level of the word line is set to α which is the lowest read-out level, and the X-address is decoded to raise the word line WL (step S11, S12). Thereafter, the level of the data line is transmitted to the sense amplifier SA, and the data that is read out is amplified by the sense amplifier (step S13). Next, the data inversion circuit DIC is controlled and the data on the data line is inverted by utilizing the data held in the sense amplifier SA (step S14). The data is amplified again by the sense amplifier SA, whereby the desired second programming data is held by the sense amplifier. Therefore, the column switch Qc is turned on to send the read-out data to the data output buffer and to output it to an external unit (step S15).

In the following Table 2, L and H represent changes in the level of the data line which occur when the second programmed data (1001) is read out from the memory cells where the data "01", "00", "10" and "11" are stored at the above-mentioned steps S8 to S15. Here, L represents that the data line is at the low level and H represents that the data line is at the high level. For comparison, in the lowest space, there are shown the levels of the data line which occur when the first programmed data (0011) are read out from the memory cells stored with the same data by allowing the word line to be at the level β. It will be understood from Table 2 that the data are correctly read out by the control according to the flowchart of FIG. 8.

TABLE 2

| 1 | Stored data | 01 | 00 | 10 | 11 |
|---|---|---|---|---|---|
| 2 | read out with γ | L | L | L | H |
|   | data inverted | H | H | H | L |
|   | read out with α | L | H | H | L |
|   | data inverted | H | L | L | H |
|   | read-out data | 1 | 0 | 0 | 1 |
| 3 | read out with β | L | L | H | H |

Next, the procedure for writing data into the memory cell will be described with reference to the flowchart of FIG. 10. It is assumed that each memory cell has been erased and has the second lowest threshold value prior to starting the programming. FIG. 11 illustrates changes in the signal lines in the memory array and in the sense latch circuit in programming the data. Symbols shown in FIG. 11 correspond to the symbols of signals shown in FIGS. 6 and 7. R or L as the last letter of some of the symbols is used for discriminating whether the signal relates to the upper mat or the lower mat on both sides of the sense latch circuit. YGi denotes a gate control signal of the column switch Qc, and PWL denotes a signal for precharging the data line and corresponds to the symbol PC in FIG. 7.

Figure 10:
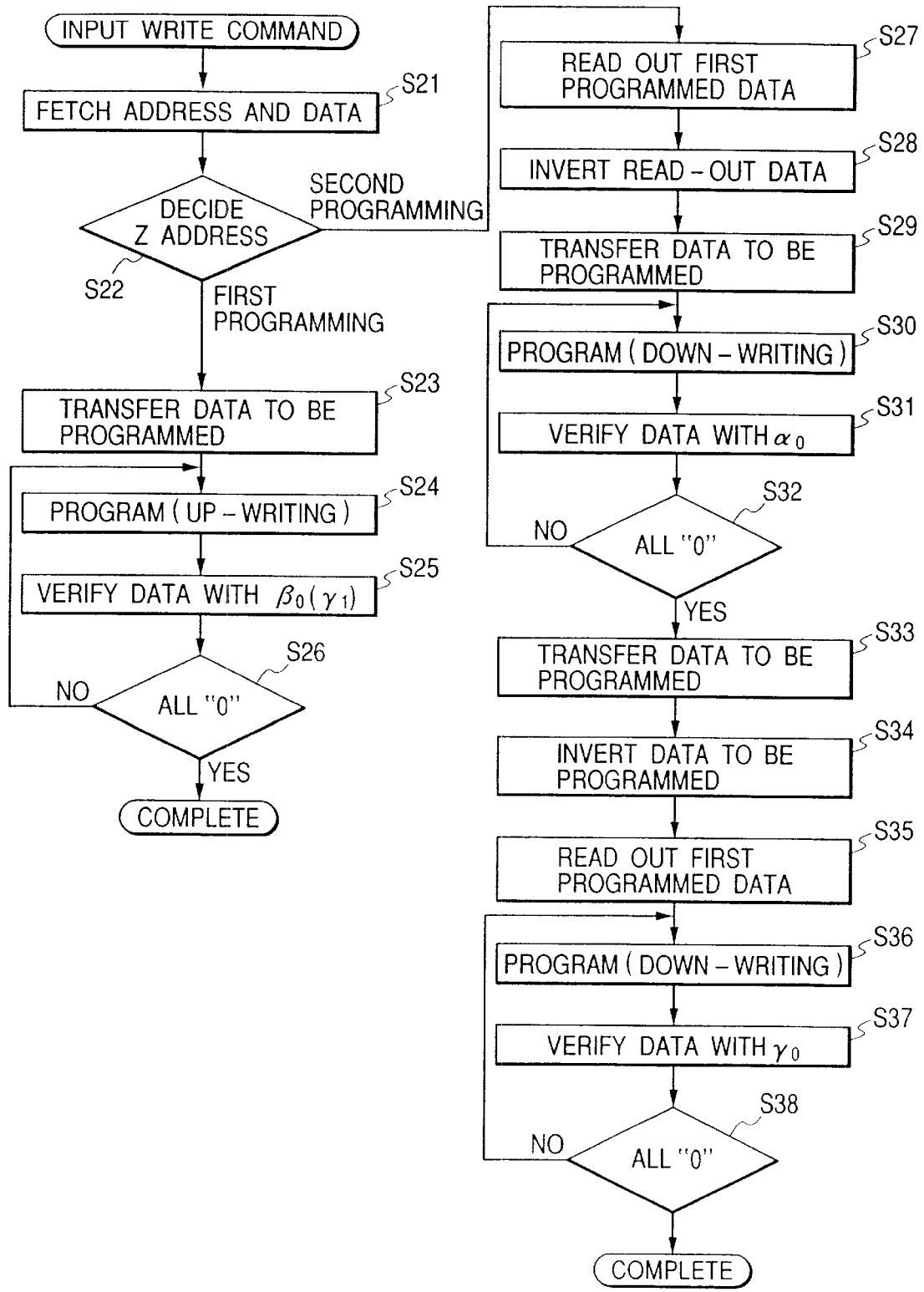
FIG. 10 is a flowchart illustrating a procedure for programming the multi-level flash memory of the embodiment.
Figure 11:
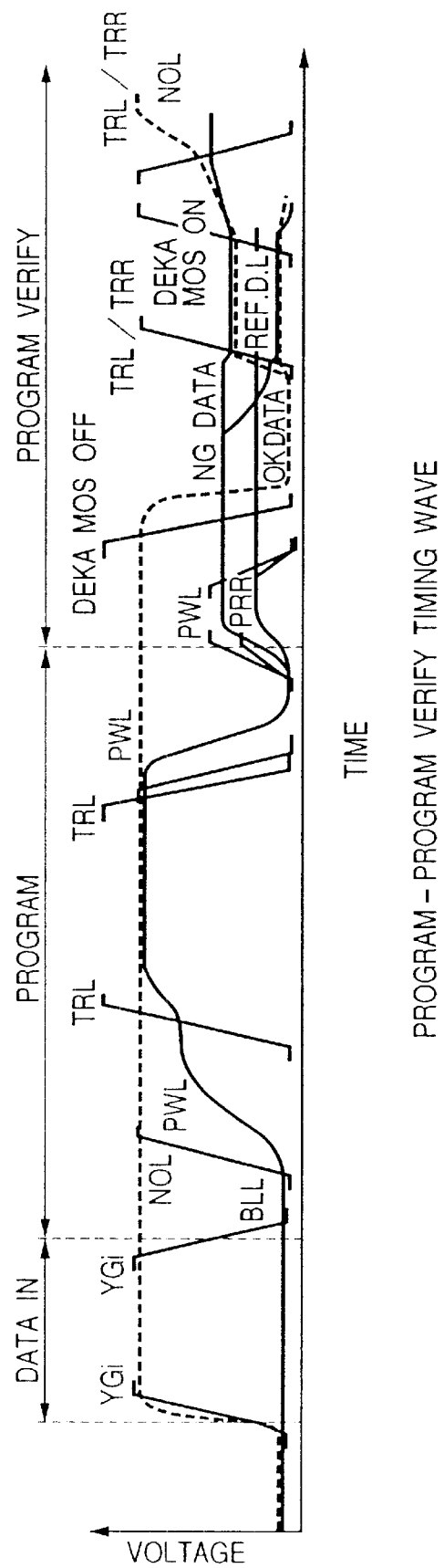
FIG. 11 is a timing chart illustrating the timings of signals in the memory array at the time of programming the multi-level flash memory of the embodiment.

As shown in FIG. 10, the programming operation is started upon the receipt of a write command from an external unit. When the command that is input is a write command, an address signal and programming data inputted just after or simultaneously with the command (step S21) are fetched. Then, based upon the Z-address among the addresses that are fetched, it is decided whether the programming corresponds to the first programming or to the second programming of the memory cell (step S22). When it is determined to be the first programming, the programming data is transferred to the sense latch (step S23). In this case, the data filter circuit DFC is so controlled as to turn Qf1 on and to turn all of Qf3 on, and unconditionally transfers the programming data to the sense amplifier SA. Next, the programming is effected so as to increase the threshold value of the memory cell of which the programming data is "1" (up-writing)(step S24).

Figure 21:
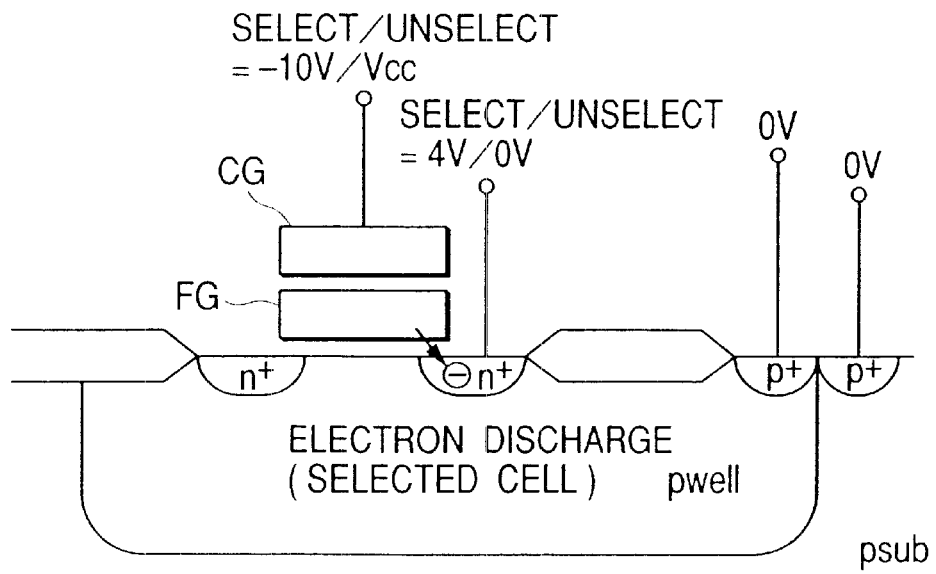
FIG. 21 is a diagram schematically illustrating the structure of a memory cell used for the flash memory of the embodiment and bias conditions for when a low threshold voltage state (logic "0") is to be established.
Figure 22:
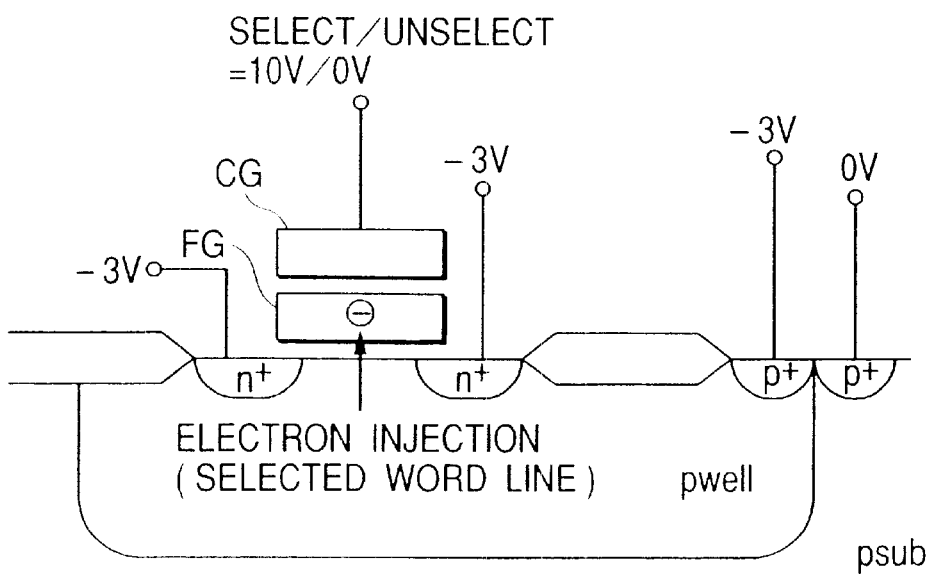
FIG. 22 is a diagram schematically illustrating the structure of a memory cell used for the flash memory of the embodiment and bias conditions for when a high threshold voltage state (logic "1") is to be established.
Figure 23:
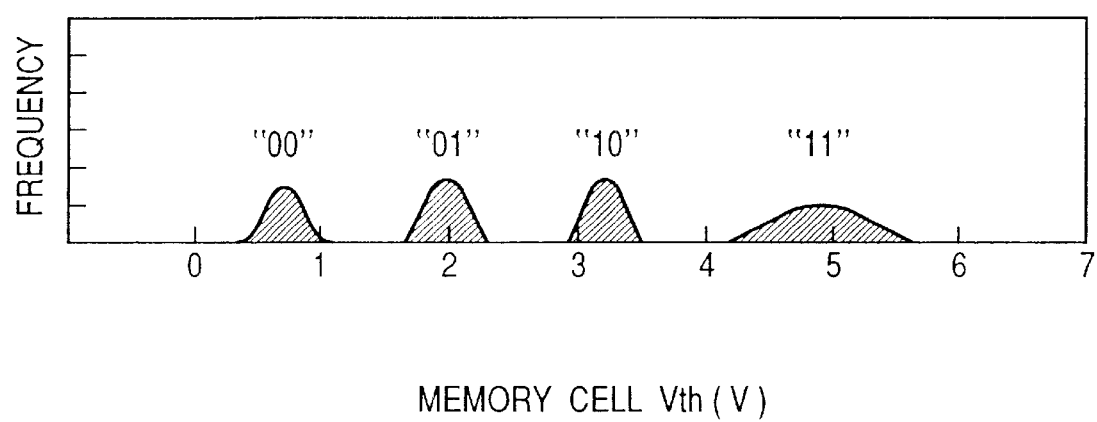
FIG. 23 is an explanatory diagram illustrating the relationship between the threshold voltage of a 4-value memory cell and the stored two-bit data according to the invention of an earlier application.

The operation of increasing the threshold value of the memory cell is effected by applying, for example, 10 V to the word line and, for example, −3 V to the well region. In the memory array constituted as in the above-mentioned embodiment, all memory cells in a sector share the word lines and the well regions and, hence, it is impossible to selectively increase the threshold value of the memory cells. In the above-mentioned up-writing operation (step S24), therefore, the threshold value of all memory cells sharing the word lines in a sector is first increased. That is, the operation is effected so that the state "00" of the memory cells is shifted to the state "11". Then, by using the data latched by the sense latch SA, the level of the selected word line is so set that a bias voltage shown in FIG. 21 is applied to memory cells that are desired to be placed in the state "00", and the switching MOSFET Qs1 and the data transfer MOSFET Qt are turned on to set the level of the selected data line, thereby discharging the electric charge from the floating gate and lowering the threshold value.

Thereafter, the level of the word line connected to the memory cell into which the data is written is set to β0 to raise the selected word line WL and to execute the verification (step S25). The verification is the same as the above-mentioned operation for reading the first programmed data and will be not described in detail. After the verification, it is determined by the current sense circuit CSC whether the data latched by all sense amplifiers SA are all "0" or not (step S26). When the normally programmed memory cell is verified, the data held by the sense amplifier changes from "1" to "0". The data "1" remains in the sense amplifier corresponding to a memory cell which has not been sufficiently programmed. When all of the data of the sense latches are not "0", the procedure returns to the step S24, where the programming is effected again by using the data held by the sense latches. The programming operation ends when it is decided through the verification operation that the data of the sense latches are all "0".

On the other hand, when it is decided that the programming to be executed at the step S22 is the second programming of the memory cell, the procedure proceeds to a step S27. In this embodiment, as described earlier, the second programming must be separately executed depending upon the first programmed data. At the step S27, therefore, the first programmed data is read out first. The level of the word line at this moment is β. To read the data, the main data line DL is precharged and, then, the word line WL is raised in the same manner as during the reading operation. Thereafter, the data inversion circuit DIC is controlled to invert the data read out by the sense amplifier SA (step S28).

Next, the data filter circuit DFC is controlled (Qf2 is turned on) so that the sense amplifier SA fetches the input programming data according to the data held by the sense amplifier SA (step S29). At this moment, data representing the logical product (AND) of the inverted read-out data and the input data is held by the sense amplifier SA. The following Table 3 shows changes in the data which occur when the first programmed data is read out from a memory in which the data "001" is stored, and the second programming data "1100" is input thereto at the above-mentioned steps S27 to S29. It will be understood from Table 3 that the data "1" remains only in a sense amplifier corresponding to a memory cell in which the date "00" is changed to "01" in the upper part of FIG. 5(C).

TABLE 3

| First programmed data | 0 | 0 | 1 | 1 |
|---|---|---|---|---|
| Inverted data | 1 | 1 | 0 | 0 |
| Input data | 1 | 0 | 0 | 1 |
| Final data | 1 | 0 | 0 | 0 |

Thereafter, the level of the selected word line and the level of the selected data line are so set that a bias voltage shown in FIG. 21 is applied to a memory cell in which the programmed data held by the sense amplifier is "1", and the switching MOSFET Qs1 and the data transfer MOSFET Qt are turned on in order to discharge the electric charge from the floating gate and to lower the threshold value (step S30).

Thereafter, the level of the word line through which programming is performed is set to α0, and the selected word line WL is raised to execute the verification (step S31). After the verification, it is decided by the current sense circuit CSC whether the data of all sense latches are all "0" (step S32). When the memory cell that is normally programmed is verified, the data held by the sense amplifier SA changes from "1" to "0", and the data "1" remains in the sense amplifier SA that corresponds to the memory cell which has not been sufficiently programmed. When the data of the sense latches are not all "0", therefore, the procedure returns to the step S30, where the programming is effected again by using the data held in the sense latches. When it is decided by the verification operation that the data of the sense latches are all "0", the first programming operation ends.

Next, the procedure proceeds to a step S33, and the second programming data is fetched again by the sense amplifier SA. At this moment, the data filter circuit DFC is so controlled as to turn the MOSFET Qf1 on and to turn all MOSFETs Qf3 on, and unconditionally transfers the programming data to the sense amplifier. Then, the data inversion circuit DIC is controlled to invert the data read out by the sense amplifier SA (step S34). Then, the data line is precharged by using the data held by the sense amplifier SA to read out the data (step S35). At this moment, the level of the word line is β which is the same level as for reading out the first programmed data. Therefore, the memory cell of which the first programmed data is "0", is turned on, whereby the data line is discharged and the data in the corresponding sense amplifier turns to "0". The following Table 4 shows changes in the data which occur when the first programmed data is read out from a memory cell in which the data "0011" is stored, and the second programming data "1100" is input thereto at the above-mentioned steps S33 to S35. It will be understood from Table 4 that the data "1" remains only in a sense amplifier corresponding to a memory cell in which the data "11" is changed to "10" in the lower part of FIG. 5(C).

TABLE 4

| First programmed data | 0 | 0 | 1 | 1 |
|---|---|---|---|---|
| Input data | 1 | 0 | 0 | 1 |
| Inverted data | 0 | 1 | 1 | 0 |
| Final data | 0 | 0 | 1 | 0 |

Thereafter, the level of the selected word line and the level of the selected data line are so set that a bias voltage shown in FIG. 21 is applied to a memory cell in which the programmed data held by the sense amplifier is "1", and the switching MOSFET Qs1 and the data transfer MOSFET Qt are turned on in order to discharge the electric charge from the floating gate and to lower the threshold value (step S36).

Thereafter, the level of the programmed word line is set to γ0, and the selected word line WL is raised to Derform verification (step S37). After the verification, it is determined by the current sense circuit CSC whether the data of all sense latches are all "0" (step S38). When the memory cell that is normally programmed is verified, the data held by the sense amplifier SA changes from "1" to "0", and the data "1" remains in the sense amplifier that corresponds to the memory cell which has not been sufficiently programmed. When the data of the sense latches are not all "0", therefore, the procedure returns to the step S36, where the programming is effected again by using the data held in the sense latches. When it is decided by the verification operation that the data of the sense latches are all "0", the programming operation ends.

In the above description, to write the first programming data (up-writing) in the above-mentioned embodiment, the threshold value of only the memory cell which is desired to be maintained in the state "00" is lowered after the threshold value of all memory cells is first increased. It is, however, also possible to execute a programming operation which selectively increases the threshold value of only the memory cell into which the first programming data "1" is desired to be written by the method described below.

That is, the only thing to be done is that a voltage is applied to the drain of a memory cell of which the threshold voltage is not to be increased, and a channel is formed just under the gate electrode to block the injection of an electric charge into the floating gate. Concretely speaking, a voltage of, for example, 10 V is applied to the word line and a voltage of, for example, −3 V is applied to the well region. Then, a voltage of, for example, 3 V is applied to the drain of a memory cell which is not to be changed from the state "00" to the state "11", and a voltage of, for example, −3 V is applied to the drain of a memory cell which is to be changed from the state "00" to the state "11". The level of the word line at the time of verification is γ1.

Next, the procedure for erasing the data stored in the memory cell will be described with reference to the flowchart of FIG. 12.

Figure 12:
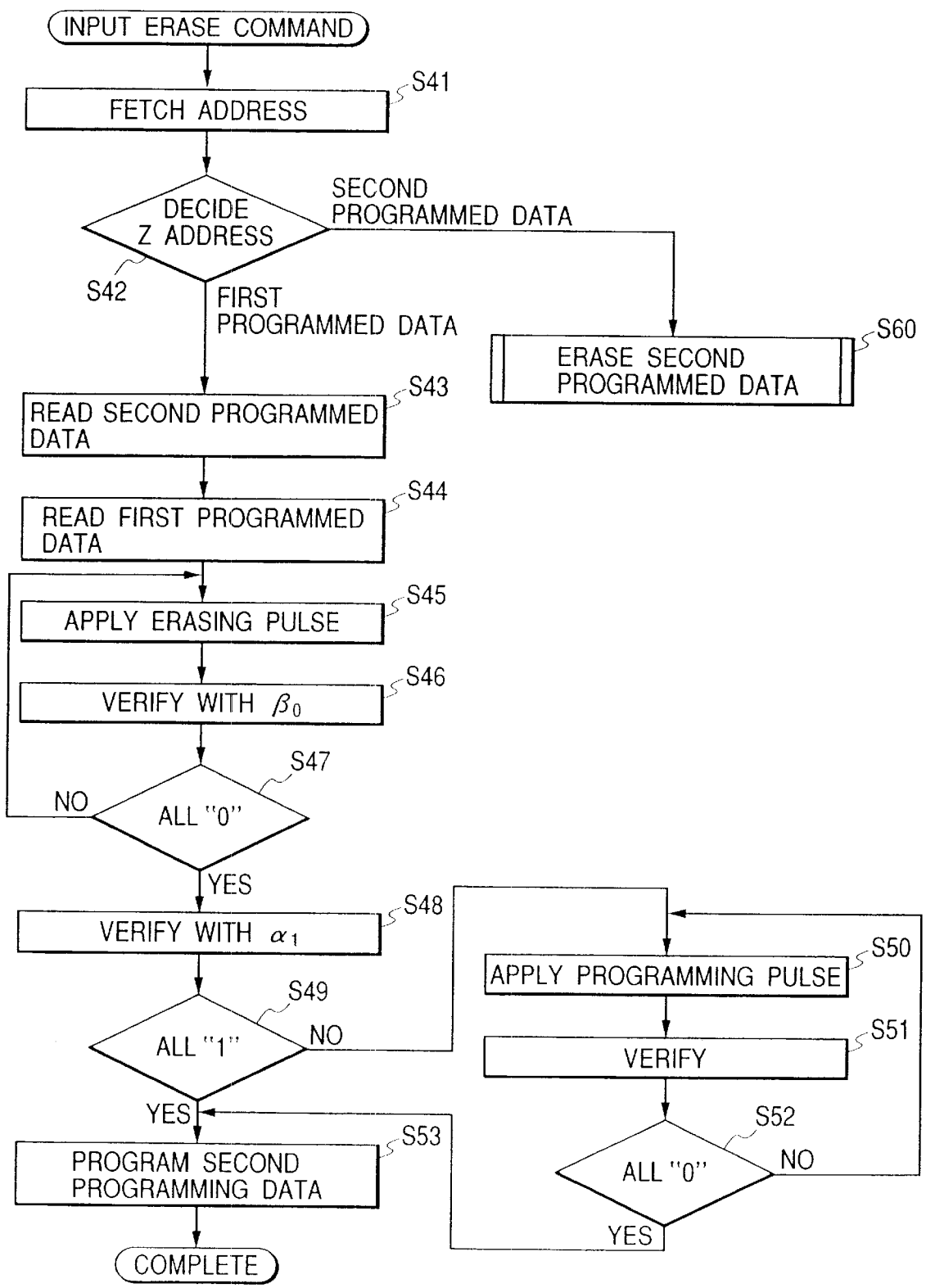
FIG. 12 is a flowchart illustrating a procedure for erasing the data from the multi-level flash memory of the embodiment.

As shown in FIG. 12, the erasing operation is started upon the input of an erase command from an external unit. When the command that is inputted is an erase command, address signals are inputted just after or simultaneously with the command (step S41). It is then decided, based on the Z-address among the fetched addresses, whether the data to be erased is the first programmed data or the second programmed data in the memory cell (step S42). When it is decided that it is the first programmed data, the second programmed data is read out from a memory cell designated by the X-address and is output to the outside of the memory (step S43). The second programmed data output to the external unit is stored in the buffer memory by a controller or the like.

Next, the first programmed data is read out from the memory cell designated by the input address and held in the sense latch (step S44). By using the thus held data, the level of the selected word line and the level of the selected data line are so set that a bias voltage shown in FIG. 21 is applied to a memory cell of which the read-out data is "1", whereby the switching MOSFET Qs1 and the data transfer MOSFET Qt are turned on, discharging the electric charge from the floating gate and lowering the threshold value to effect the erasing (step S45).

Thereafter, the level of the erased word line is set to β0 to raise the selected word line WL and to perform verification (step S46). The verification operation is the same as the above-mentioned operation for reading the data (FIG. 8), and will be not described in detail. After the verification, it is determined by the current sense circuit CSC whether the data of all sense latches are all "0" or not (step S47). When the normally programmed memory cell is verified, the data held in the sense latch changes from "1" to "0", and the data "1" remains in the sense latch corresponding to the memory cell that has not been properly programmed. When the data of the sense latches are not all "0", the procedure returns to the step S45 where the erasing is effected again by using the data held by the sense latch.

When it is decided through the verification operation that the data of the sense latches SA are all "0", the level of the word line is set to α1 and the selected word line WL is raised to perform verification (step S48). After the verification, it is determined whether the data of all sense latches are all "1" (step S49). The decision of all "1" is easily effected by an all-decision circuit constituted by a MOSFET Qj provided on the opposite side of the sense latch SA and a current sense circuit CSC, or by providing a similar circuit constituted by a P-channel MOSFET instead of the MOSFET (N-channel) Qj of FIG. 7. When the data of the sense latches are not all "1", the procedure proceeds to a step S50, where the programming is so effected, by using the data held by the sense latch, as to increase the threshold value of the memory cell of which the read-out data is "0" and, then, the verification is effected again (step S51). When it is decided through the verification operation that the data in the sense latches are all "0" (step S52), the second programmed data stored in the external buffer memory is input and written into the memory (step S53). This programming operation is executed according to a procedure similar to the flowchart of FIG. 10.

When it is decided that the data to be erased at the step S42 is the second programmed data of the memory cell, the procedure proceeds to a step S60 for erasing the second programmed data. The process of erasing the second programmed data is carried out by substantially the same procedure as the process of erasing the first programmed data at the steps S41 to S51. The difference is that the first programmed data is read out erasing the second programmed data, the erasing for increasing the threshold value is effected separately from the erasing for lowering the threshold value depending upon the first programmed data. Since the erasing for increasing the threshold value and the erasing for lowering the threshold value are separately executed depending upon the first programmed data, a control operation similar to the one executed at the steps S27 to S38 in the flowchart for executing the programming of FIG. 10 is adopted.

Figure 13:
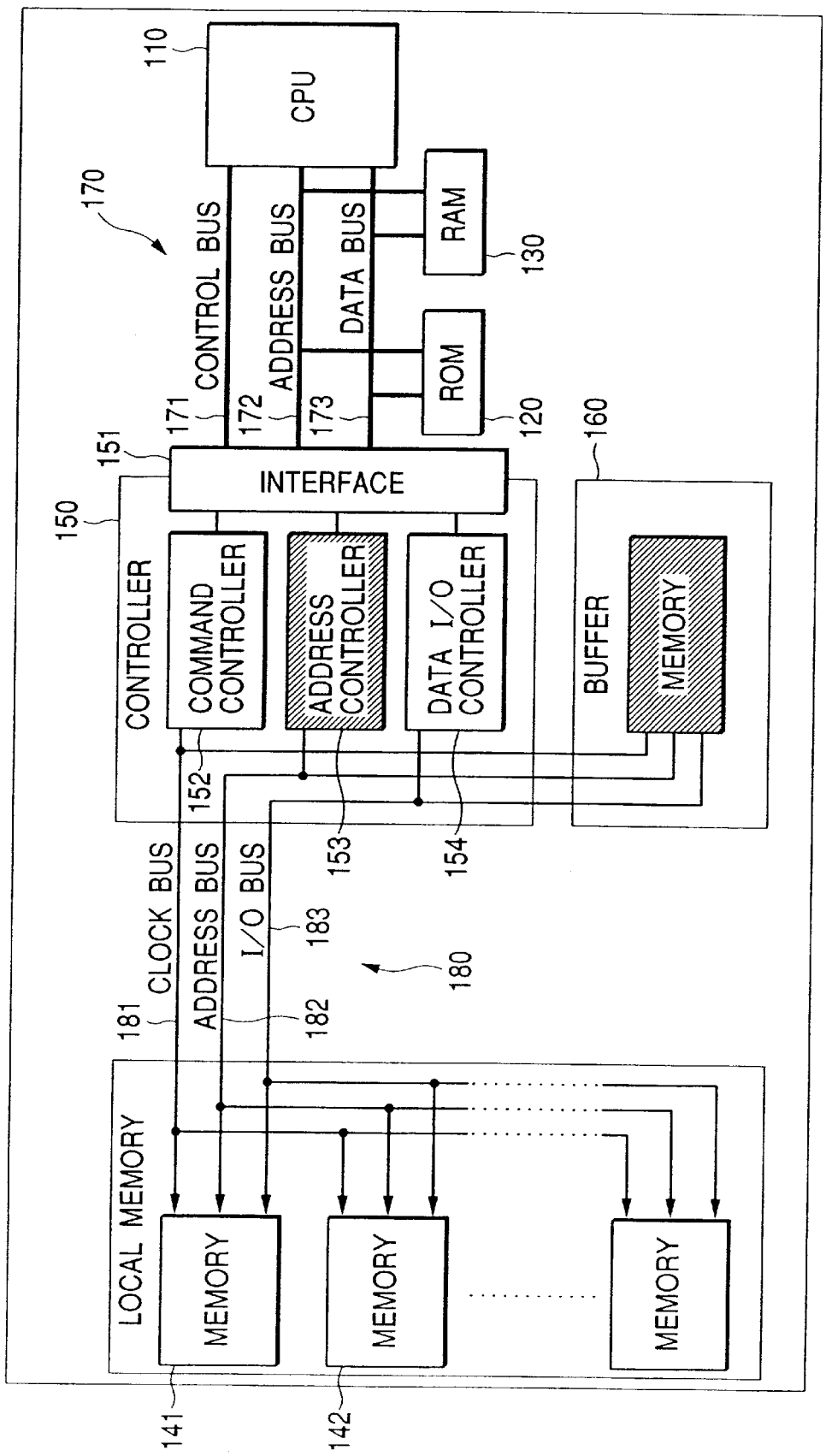
FIG. 13 is a block diagram of a system using the multi-level flash memory of the embodiment.

FIG. 13 illustrates the constitution of a system using the multi-level flash memory of the above-mentioned embodiment.

Though there is no particular limitation, the system of this embodiment is constituted by a microcomputer (CPU) 110 for controlling the whole system, a read-only memory (ROM) 120 for storing the program and fixed data of the system, a random access memory (RAM) 130 in/from which data can be randomly written/read to provide a working area to the CPU 110, a local memory 140 including multi-level flash memories 141, 142, . . . of the above-mentioned embodiment, a memory controller 150 for controlling the read, write and erase operations on the data in the local memory 140, and a buffer memory 160 used for saving the second programmed data or the first programmed data at the time of erasing or rewriting the data in the local memory 140.

The CPU 110, the ROM 120, the RAM 130 and the memory controller 150 are connected together through a main bus 170 which includes a control bus 171, an address bus 172 and a data bus 173. The flash memories 141, 142, . . . , the memory controller 150 and the buffer memory 160 are connected together through a local bus 180 which includes a clock bus 181, an address bus 182 and an I/O bus 183. Though there is no particular limitation, these ICs and the bus are mounted on a single board such as a printed wiring board.

The memory controller 150 includes an interface circuit 151 for interface with the CPU 110; a command controller 152 which generates and outputs a read-out command, a write command, an erase command and a data transfer clock to the flash memories 141, 142, . . . in response to an instruction from the CPU 110; an address controller 153 which converts addresses into physical addresses of the flash memories 141, 142, . . . based upon the logical addresses output from the CPU 110, and converts them into the above-mentioned three-dimensional addresses; and a data I/O controller 154 which transfers the data read out from the flash memories 141, 142, . . . to the RAM 130, and transfers the programming data from the RAM 130 to the flash memories 141, 142, . . .

FIGS. 14 to 17 illustrate other embodiments of the system for discriminating data depending upon the hierarchy in the memory cell (corresponding to the method based on the Z-address of the above-mentioned embodiment).

Figure 14:
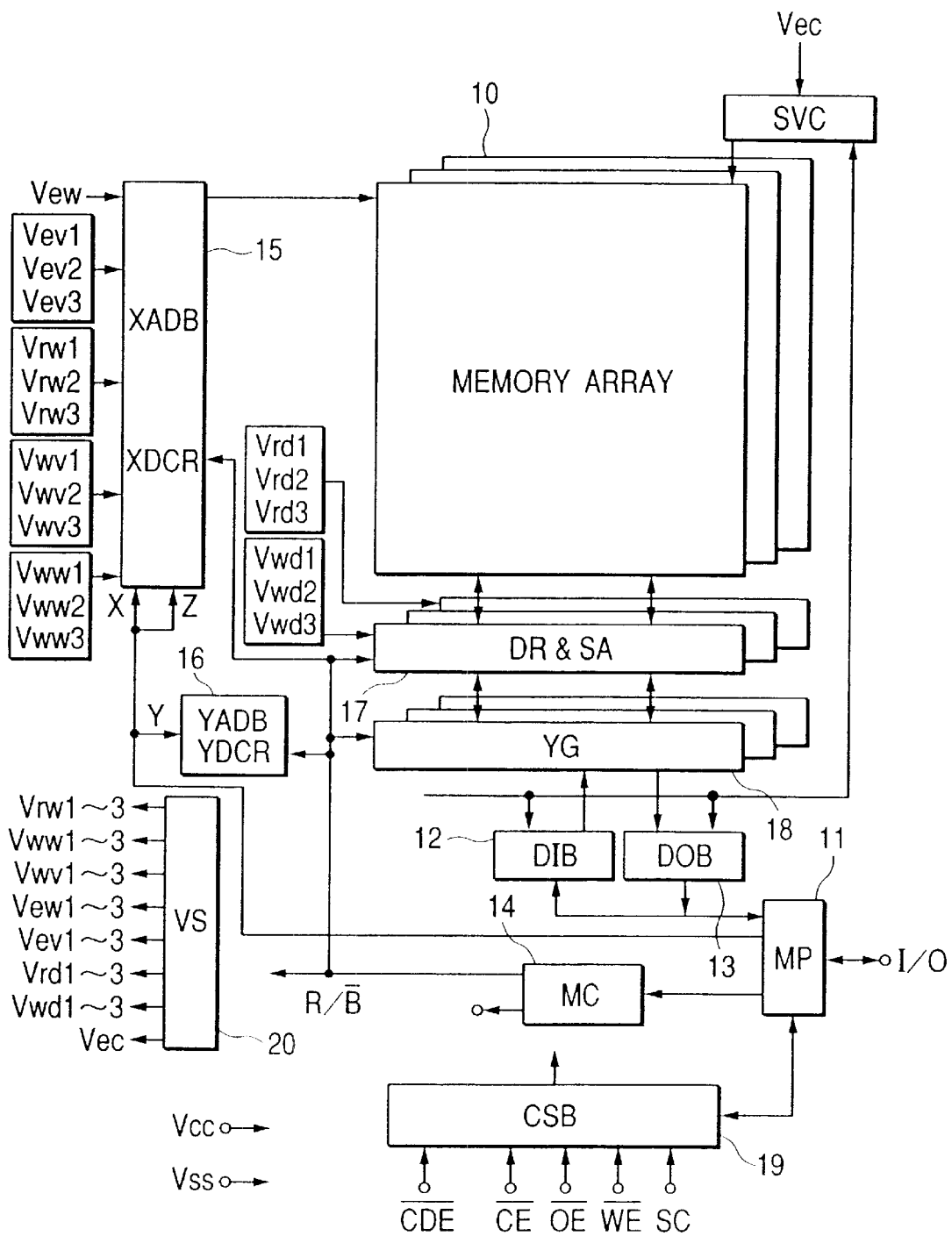
FIG. 14 is a block diagram schematically illustrating a second embodiment of the multi-level flash memory according to the present invention.

Among them, FIG. 14 illustrates a constitution for inputting, in a time division manner, the Z-address together with the data, command, X-address and Y-address through the input/output pins I/O, instead of inputting the Z-address through special-purpose external terminals (see symbol AZ of FIG. 2). The Z-address inputted to the input/output pins I/O is fed to an X-address decoder 15 through a multiplexer 11. Likewise, a X-address and a Y-address are fed to the X-address decoder 15 and to the Y-address decoder 16 through the multiplexer 11. Command or data and an address are distinguished from each other using a control signal CDE from an external unit. The command and data are distinguished from each other in a manner such that the command is inputted in synchronism with a write enable signal WE, and the data is inputted in synchronism with a serial clock SC.

Figure 15:
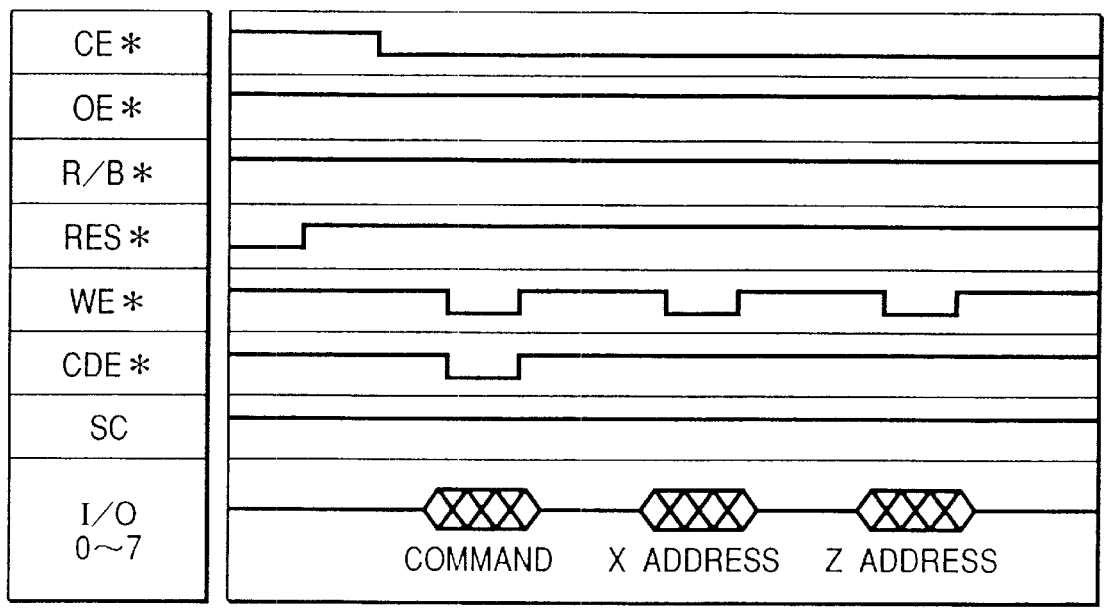
FIG. 15 is a timing chart illustrating a time division method of a third embodiment of the multi-level flash memory according to the present invention.
Figure 16:
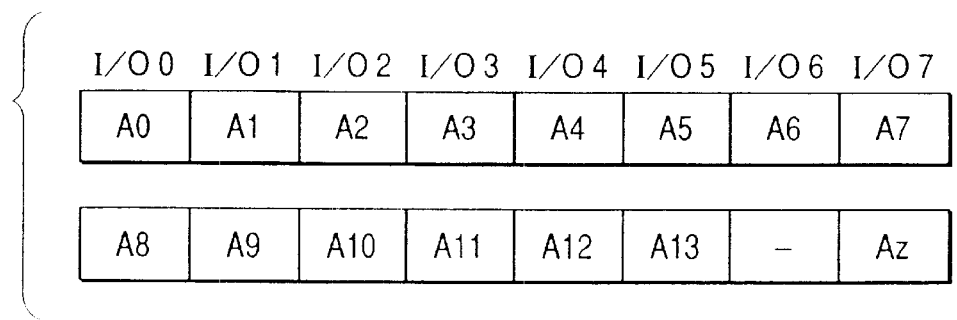
FIG. 16 is a diagram illustrating the constitution of addresses according to a fourth embodiment in the multi-level flash memory according to the present invention.

Relative to the address multiplexing method in which the above-mentioned pins are commonly used, there can be contrived a method for separately fetching the X-address and the Y-address at different timings and a method for fetching the Z-address by utilizing a free bit in the X-address as shown in FIG. 15. The method shown in FIG. 16 serves to illustrate the address constitution when the Z-address (1 bit) is to be fetched by using 1 bit between the free two bits of the highest order in the case where an X-address of 14 bits is to be fetched in two operations by using eight input/output pins I/O.

It is also allowable to input the Z-address by including it in a command, instead of including the Z-address in the X-address. Moreover, the read command, write command and erase command may be separately prepared for each of the data depending the hierarchy in the memory cell. Even in this case, as shown in FIG. 14, there can be contrived a method for inputting the address and the command in a time division manner as shown in FIG. 14 and a method for inputting them through separate external terminals as shown in FIG. 2. In addition to the address or command, furthermore, a control signal or a selection signal may be used for discriminating the data depending upon the hierarchy in the memory cell.

Figure 17:
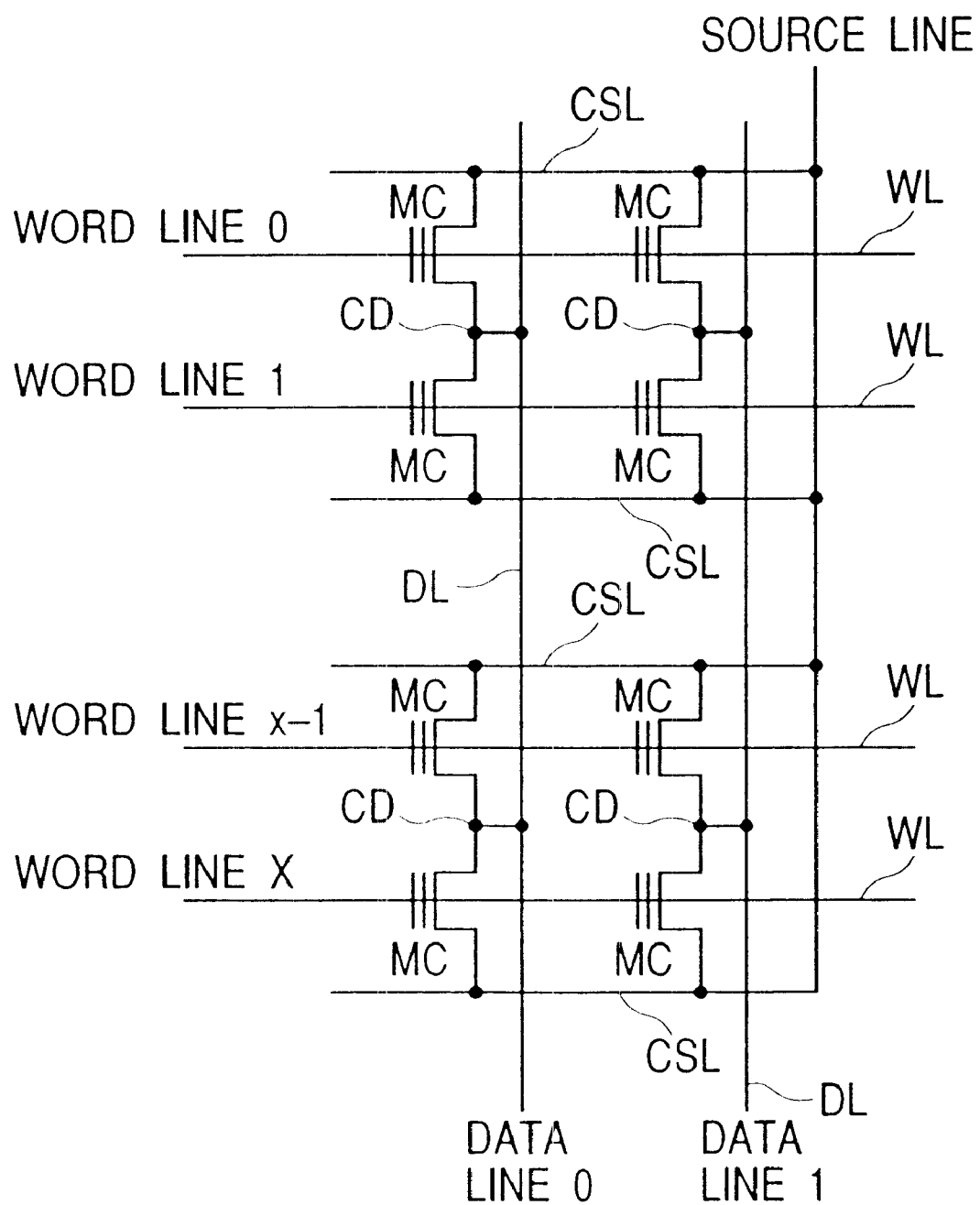
FIG. 17 is a schematic circuit diagram illustrating another embodiment of the memory array in the multi-level flash memory according to the present invention.

FIGS. 17 to 20 illustrate other constitutions of the memory array 10. In the memory array of the above-mentioned embodiment (see FIG. 6), the sources of n memory cells MC arranged in the direction of the data lines are connected to the common subsource line SSL, the drains are connected to the common subdata line SDL, the subdata line SDL is connected to the data line through the switching MOSFET Qs1, and the subsource line SSL is connected to the common source line CSL through the switching MOSFET Qs2. In the embodiment of FIG. 17, on the other hand, the memory cells MC are arranged in pairs in the direction of data lines, a common drain CD of each pair is connected to a corresponding main data line DL, and the sources of the memory cells in the direction of the word lines WL are connected to the common source line CSL for every memory row. The sense latch circuit SLT connected to each data line is the same as that of the memory array (see FIG. 6) of the above-mentioned embodiment. In the memory array of this embodiment, the reading/programming operations are carried out in quite the same manner as that of the memory array (see FIG. 6) of the above-mentioned embodiment, except for the control operation performed by the switching MOSFETs Qs1, Qs2. It is further possible to provide a subdata line and a subsource line to be controlled by the switching MOSFETs Qs1 and Qs2.

Figure 18:
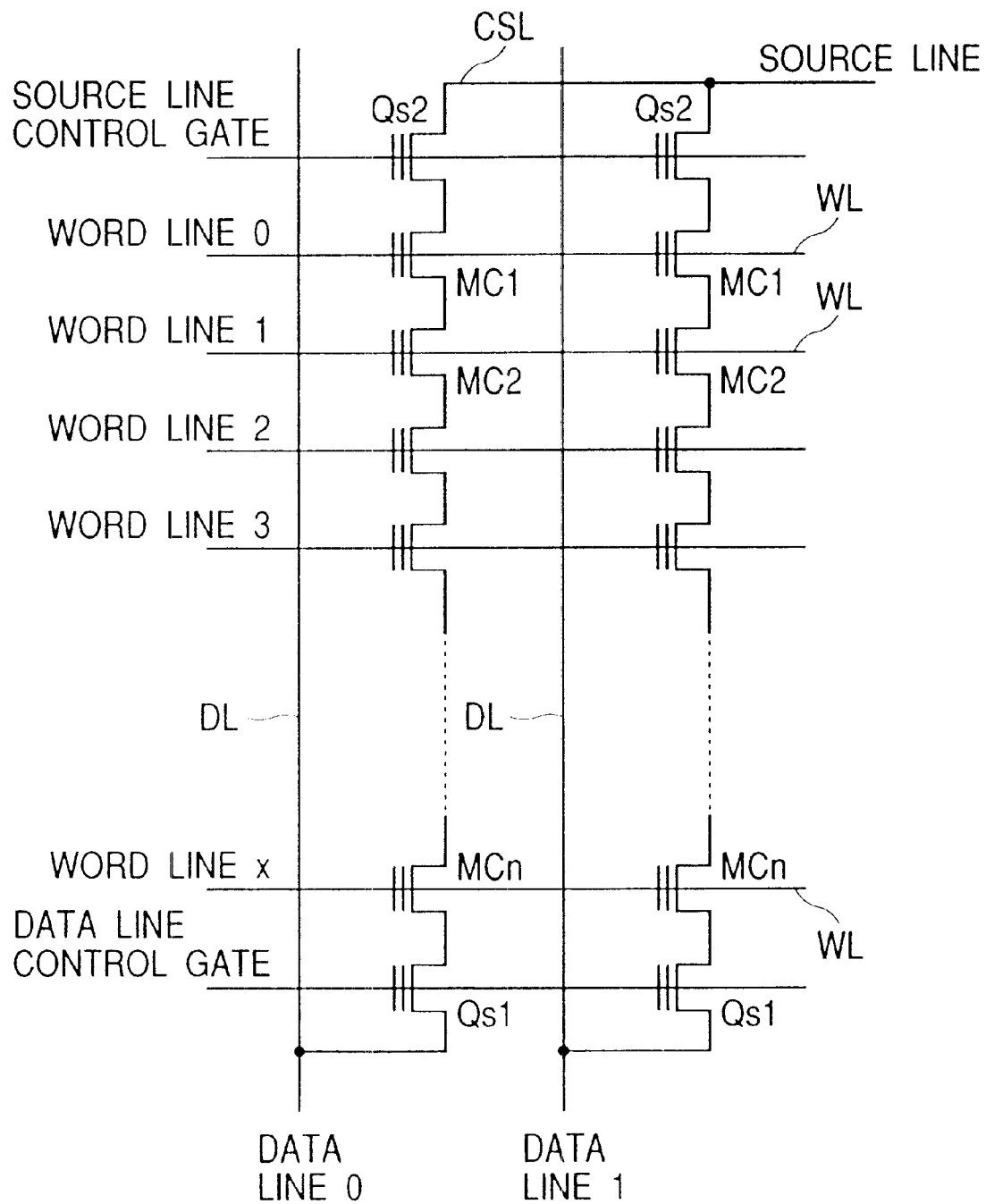
FIG. 18 is a schematic circuit diagram illustrating a further embodiment of the memory array in the multi-level flash memory according to the present invention.

FIG. 18 is a memory array of the so-called NAND type. N memory cells MC1 to MCn are so arranged in the direction of the main data line DL that their channels are connected in series, one end thereof (lower end in the drawing) is connected to the main data line DL via the switching MOSFET Qs1, and the other end (upper end) thereof is connected to the common source line CSL via the switching MOSFET Qs2. In this embodiment, the potential of the word line other than the selected word line is set to such a high level that the switching MOSFETs are turned on irrespective of the threshold value of the memory cell connected thereto, and the selected word line is set to a potential corresponding to the first programmed data or the second programmed data, thereby reading or programming the data. Thus, the selected memory cell performs a reading/programming operation.

Figure 19:
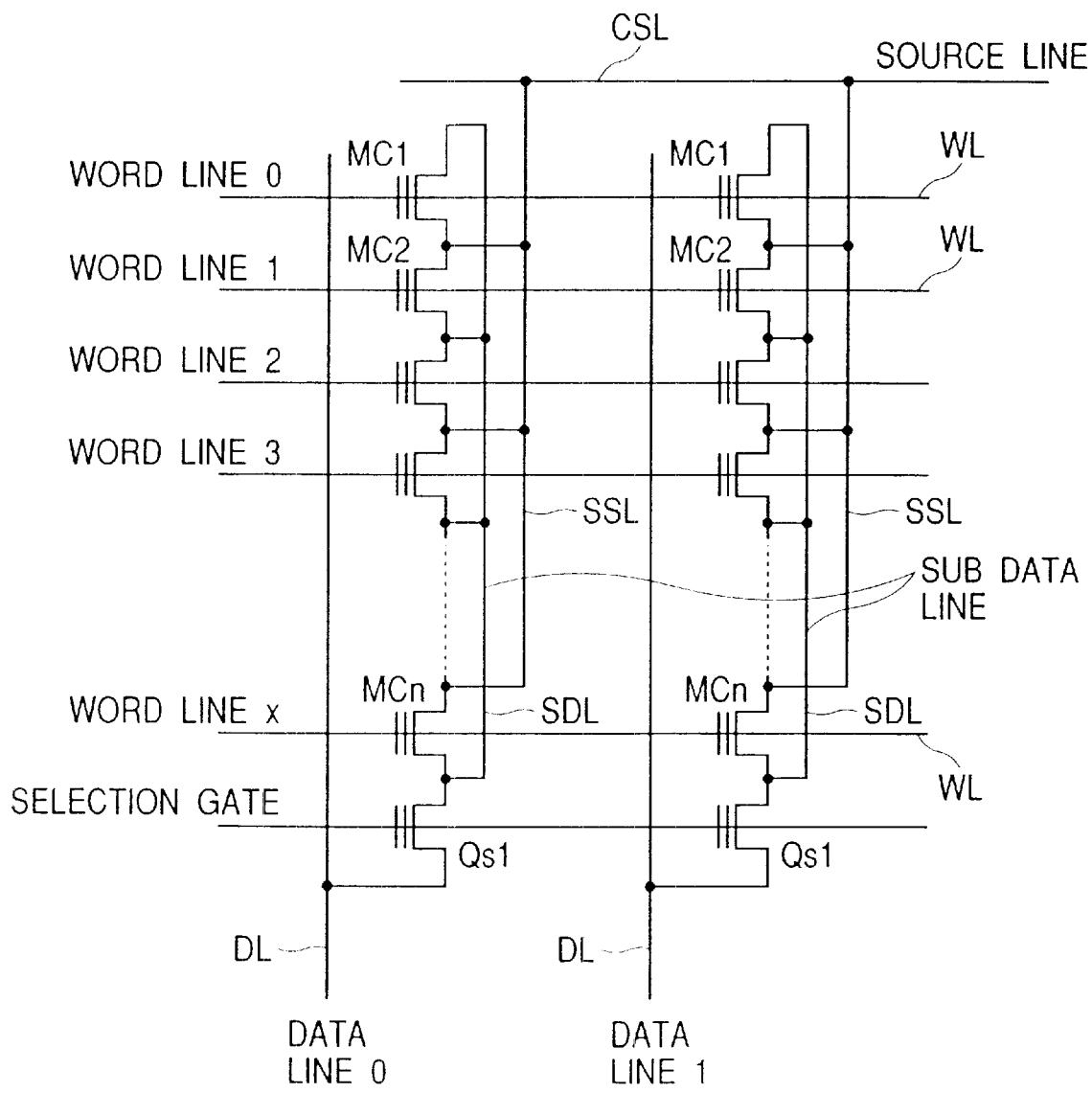
FIG. 19 is a schematic circuit diagram illustrating a still further embodiment of the memory array in the multi-level flash memory according to the present invention.

Referring to FIG. 19, the n memory cells MC1 to MCn arranged in the direction of the main data line DL are so arranged that their channels are connected in series, the common sources and the common drains are alternatingly connected to the subdata lines SDL and to the subsource lines SSL, and the subdata lines SDL are connected to the corresponding main data lines DL through the switching MOSFET Qs1. This embodiment is the same as that of the memory array (see FIG. 6) of the above-mentioned embodiment, except that the mutually adjacent memory cells in the direction of the main data line DL share the source and the drain, and no switching MOSFET Qs2 is used. The reading/programming operations are carried out by the same control except for the control of Qs2. It is, however, also possible to provide Qs2 between the subsource line SSL and the common source line CSL.

Figure 20:
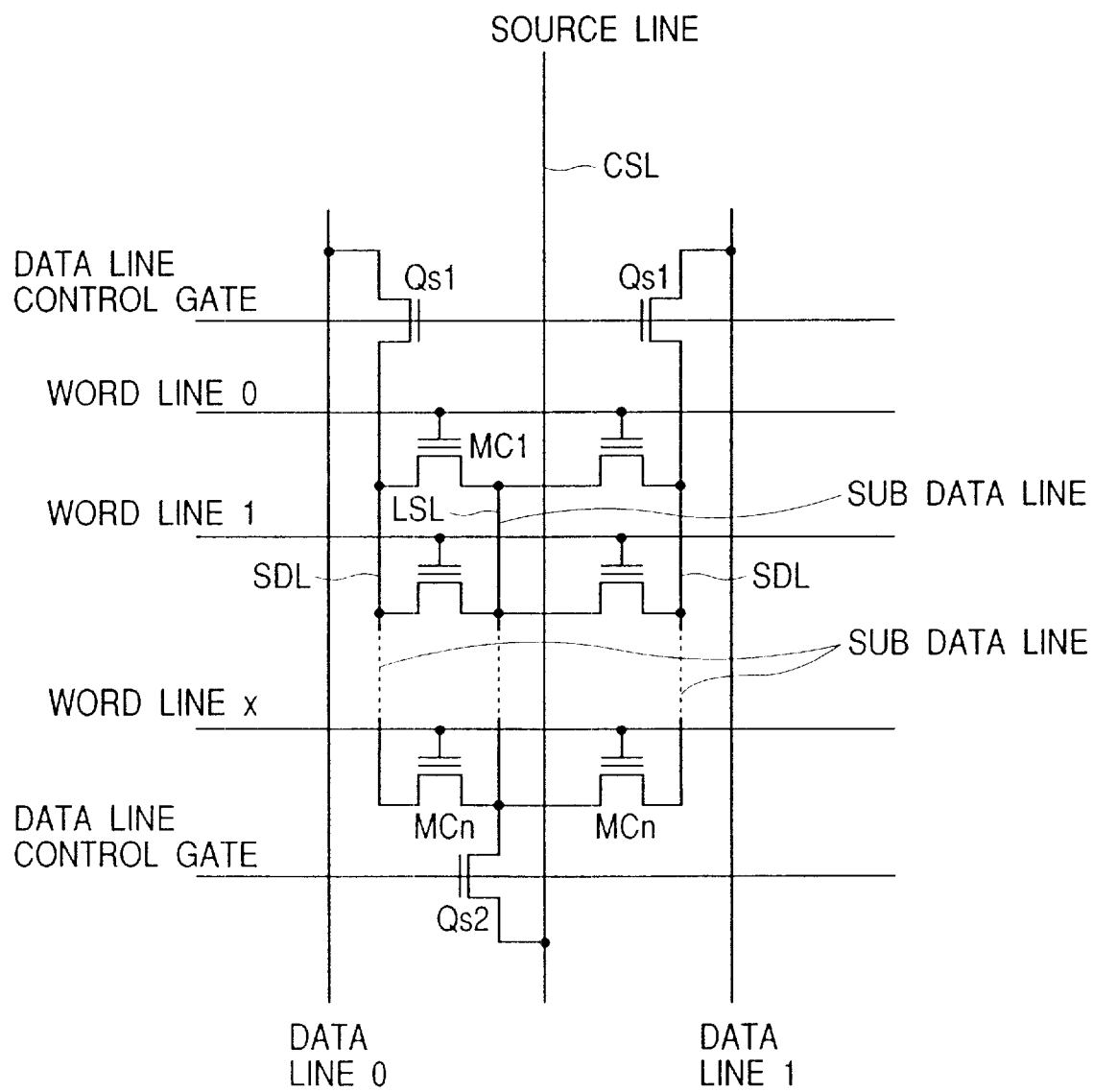
FIG. 20 is a schematic circuit diagram illustrating a yet further embodiment of the memory array in the multi-level flash memory according to the present invention.

FIG. 20 illustrates a modification of the above-mentioned embodiment (FIG. 6) and is the same in that the drains of the n memory cells MC arranged in the direction of the data lines are connected to a common subdata line SDL which is connected to the data line through the switching MOSFET Qs1. In this embodiment, however, the memory cells are connected in pairs in the direction of the word lines, and their common sources are connected to the subsource lines SSL to decrease the number of the subsource lines SSL. The subsource line SSL is connected to the common source line CSL through the switching MOSFET Qs2. The sense latch circuit SLT may be constituted quite in the same manner as that of FIG. 7, and performs the reading/programming operation by the same control.

As described above, in the embodiments, in a nonvolatile semiconductor memory device in which data of multiple levels are stored in memory cells by setting a plurality of threshold values, the bits of 2-bit data are separately written into one memory cell depending upon the address signal or the control signal. At the time of reading the data, therefore, the first bit (first programmed data) is read out by accessing the word line only one time, and the second bit (second programmed data) is read out by accessing the word line two times while changing the level. This makes it possible to decrease the total number of accesses to the word line and to shorten the time taken to read the data.

In the above-mentioned embodiments, furthermore, a data inversion circuit is provided between a data line in the memory array and the sense amplifier that amplifies the read-out data, making it possible to efficiently read out the second programmed data.

In the above-mentioned embodiments, furthermore, a data filter circuit is provided between the data input buffer and the sense amplifier to control the input of programming data depending upon the data read out by the sense amplifier, making it possible to efficiently write the second programming data in accordance with the first programming data.

In the above-mentioned embodiments, furthermore, the address signal for discriminating the data depending upon the hierarchy in the memory cell is input in a time division manner together with the command or the data, making it possible to decrease the number of the required external terminals (pins).

In the foregoing, the invention has been described by way of various embodiments, but the invention is in no way limited to them and can be modified in a variety of ways without departing from the spirit and scope of the invention. For example, the above-mentioned embodiments have dealt with the case where 2-bit data is stored in a memory. The invention, however, can also be adapted even to a nonvolatile memory in which data of three or more bits is stored in a memory cell.

In the above-mentioned embodiments, furthermore, the memory cell having the second lowest threshold value is regarded as a memory cell of the erased state. However, a threshold value of any other level may be employed to establish the erased state. In the embodiments, furthermore, the threshold value is changed by effecting the programming of a memory cell that corresponds to a sense amplifier which is holding the data "1". It is, however, also possible to change the threshold value by effecting the programming of a memory cell that corresponds to a sense amplifier which is holding the data "0".

The foregoing description has been made relative to the case where the present invention is applied to a flash memory.

However, the present invention is in no way limited thereto only, but can be utilized for general nonvolatile memory devices using FAMOSs as memory elements, as well as to semiconductor devices equipped with memory cells having a plurality of threshold values.

We claim:

1. A nonvolatile memory device comprising:
    a plurality of nonvolatile memory cells, each of which has a threshold voltage within a plurality of threshold voltage distributions;
    a plurality of word lines, each of which is coupled to corresponding ones of said nonvolatile memory cells; and
    a controller,
    wherein said controller controls a first operation in which said controller receives address information and data, selects one of said word lines corresponding to said address information and controls to change said threshold voltage of ones of said nonvolatile memory cells coupled to said selected word line to one of the threshold voltage distributions according to said data,
    wherein, when said controller controls said first operation with first address information and first data, said controller selects a first word line and controls to change said threshold voltage to a first threshold voltage distribution or a second threshold voltage distribution according to said first data from said first threshold voltage distribution, and wherein, when said controller controls said first operation with second address information and second data, said controller selects said first word line and controls to change said threshold voltage according to said second data to said first threshold voltage distribution or a third threshold voltage distribution from said first threshold voltage distribution or to change to said second threshold voltage distribution or a fourth threshold voltage distribution from said second threshold voltage distribution.

2. A nonvolatile memory device according to claim 1, wherein said controller controls a second operation in which said controller controls to change said threshold voltage of ones of said nonvolatile memory cells to said first distributions of said threshold voltage distributions which indicate an erase state.

3. A nonvolatile memory device according to claim 2, further comprising a plurality of terminals to receive said address information,
wherein said plurality of terminals receives first signals in the case of receiving said first address information and receives second signals in the case of receiving said second address information, wherein said first and second signals differ only by one bit.

4. A nonvolatile memory device according to claim 2, further comprising a plurality of first terminals to receive said address information and a second terminal,
wherein said plurality of first terminals each receive the same signals regardless of whether said first address information is received, and
wherein said second terminal receives a different signal when said first address information is received than when second address information is received.

5. A nonvolatile memory device according to claim 17, said first distributions of said threshold voltage distributions which indicate an erase state.

6. A nonvolatile memory comprising:
a controller; and
a memory array including a plurality of word lines and a plurality of nonvolatile memory cells, each of which is coupled to a corresponding word line,
wherein each of said nonvolatile memory cells has a threshold voltage within one of a plurality of threshold voltage distributions,
wherein said controller controls a first operation, said first operation including;
receiving address information and data,
detecting said address information being of a first address type or a second address type,
selecting one word line corresponding to said address information,
moving a threshold voltage of said memory cells coupled to said selected word lines according to said data,
wherein, when said address information is said first address type:
said threshold voltage of said memory cell moves from a first threshold voltage distribution to said first threshold voltage distribution when said data of said memory cell is in a first state, or
said threshold voltage of said memory cell moves from a first threshold voltage distribution to a second threshold voltage distribution when said data of said memory cell is in a second state, and
wherein, when said address information is said second address type:

said threshold voltage of said memory cell moves from said first threshold voltage distribution to said first threshold voltage distribution when said data of said memory cell is in the first state, or
said threshold voltage of said memory cell moves from said first threshold voltage distribution to said third threshold voltage distribution when said data of said memory cell is in the second state, or
said threshold voltage of said memory cell moves from said second threshold voltage distribution to said second threshold voltage distribution when said data of said memory cell is in the first state, or
said threshold voltage of said memory cell moves from said second threshold voltage distribution to a fourth threshold voltage distribution when said data of said memory cell is in the second state.

7. A nonvolatile memory according to claim 6,
wherein said controller controls a second operation, said second operation including:
receiving address information,
detecting said address information being of a first address type or a second address type,
selecting one word line corresponding to said address information, and
detecting threshold voltage levels of said memory cells coupled to said selected word line,
wherein, when said address information is said first address type:
supplying a first read voltage to said selected word line,
detecting whether said threshold voltage is higher than said first read voltage or not,
supplying a second read voltage to said selected word line,
detecting whether said threshold voltage is higher than said second threshold voltage or not,
supplying a third read voltage to said selected word line,
detecting whether said threshold voltage is higher than said third threshold voltage or not, and
outputting data when said threshold voltage of the memory cell is higher than said first read voltage and is higher than said second read voltage, or when said threshold voltage of the memory cell is lower than said first read voltage and is higher than said third read voltage and output data of said memory cell is in the first state, or
when said threshold voltage of the memory cell is higher than said first read voltage and is lower than said second read voltage, or when said threshold voltage of the memory cell is lower than said first read voltage and is lower than said third read voltage and output data of said memory cell is in the second state.

8. A nonvolatile memory according to claim 7,
wherein said controller controls a third operation, said third operation including:
receiving an address information,
selecting one word line corresponding to said address information, and
moving threshold voltages of said memory cells coupled to said selected word line to said first threshold voltage distribution.

* * * * *